US00RE45520E

(19) United States
(12) Reissued Patent
Dutta et al.

(10) Patent Number: US RE45,520 E
(45) Date of Reissued Patent: May 19, 2015

(54) DATA STATE-DEPENDENT CHANNEL BOOSTING TO REDUCE CHANNEL-TO-FLOATING GATE COUPLING IN MEMORY

(71) Applicant: SanDisk Technologies Inc., Plano, TX (US)

(72) Inventors: Deepanshu Dutta, Santa Clara, CA (US); Jeffrey W Lutze, San Jose, CA (US); Grishma Shah, San Jose, CA (US)

(73) Assignee: SanDisk Technologies Inc., Plano, TX (US)

(21) Appl. No.: 14/231,073

(22) Filed: Mar. 31, 2014

Related U.S. Patent Documents

Reissue of:
(64) Patent No.: 8,169,822
Issued: May 1, 2012
Appl. No.: 12/616,269
Filed: Nov. 11, 2009

(51) Int. Cl.

| | |
|---|---|
| ***G11C 11/34*** | (2006.01) |
| ***G11C 11/56*** | (2006.01) |
| *G11C 16/34* | (2006.01) |
| *G11C 16/10* | (2006.01) |
| *G11C 16/04* | (2006.01) |

(52) U.S. Cl.
CPC ..... *G11C 11/5628* (2013.01); *G11C 16/3427* (2013.01); *G11C 16/10* (2013.01); *G11C 16/0483* (2013.01)

(58) Field of Classification Search
CPC ..... G11C 11/5628; G11C 16/0483; G11C 16/10; G11C 16/3427
USPC ..... 365/185.02, 185.17, 185.18
See application file for complete search history.

(56) References Cited

U.S. PATENT DOCUMENTS 6,859,395 B2 * 2/2005 Matsunaga et al. ..... 365/185.18
6,987,694 B2 * 1/2006 Lee ..... 365/185.17
7,170,793 B2 1/2007 Guterman
(Continued)

FOREIGN PATENT DOCUMENTS

WO WO 2007/103038 A1 9/2007

OTHER PUBLICATIONS

Chinese Office Action dated Jul. 28, 2014, Chinese Patent Application No. 201080051410.9.
(Continued)

*Primary Examiner* — Ovidio Escalante
(74) *Attorney, Agent, or Firm* — Vierra Magen Marcus LLP

(57) ABSTRACT

In a programming operation, selected storage elements on a selected word line are programmed while unselected storage elements on the selected word line are inhibited from programming by channel boosting. To provide a sufficient but not excessive level of boosting, the amount of boosting can be set based on a data state of the unselected storage element. A greater amount of boosting can be provided for a lower data state which represents a lower threshold voltage and hence is more vulnerable to program disturb. A common boosting scheme can be used for groups of multiple data states. The amount of boosting can be set by adjusting the timing and magnitude of voltages used for a channel pre-charge operation and for pass voltages which are applied to word lines. In one approach, stepped pass voltages on unselected word lines can be used to adjust boosting for channels with selected data states.

20 Claims, 15 Drawing Sheets

(56) References Cited

U.S. PATENT DOCUMENTS

| | | | | |
|---|---|---|---|---|
| 7,307,884 | B2 | 12/2007 | Guterman | |
| 7,349,258 | B2 | 3/2008 | Fong et al. | |
| 7,355,889 | B2 * | 4/2008 | Hemink et al. | 365/185.17 |
| 7,376,017 | B2 * | 5/2008 | Kim | 365/185.23 |
| 7,440,323 | B2 * | 10/2008 | Lutze et al. | 365/185.17 |
| 7,440,326 | B2 * | 10/2008 | Ito | 365/185.18 |
| 7,450,430 | B2 | 11/2008 | Hemink | |
| 7,460,404 | B1 | 12/2008 | Dong | |
| 7,606,100 | B2 * | 10/2009 | Hemink et al. | 365/218 |
| 7,738,291 | B2 * | 6/2010 | Aritome et al. | 365/185.03 |
| 7,791,942 | B2 | 9/2010 | Kim et al. | |
| 7,995,394 | B2 * | 8/2011 | Dong et al. | 365/185.19 |
| 8,169,822 | B2 | 5/2012 | Dutta et al. | |
| 8,611,148 | B2 | 12/2013 | Dutta et al. | |
| 2002/0114187 | A1 | 8/2002 | Choi et al. | |
| 2005/0057967 | A1 | 3/2005 | Khalid | |
| 2006/0221697 | A1 | 10/2006 | Li | |
| 2007/0171719 | A1 | 7/2007 | Hemink et al. | |
| 2007/0247911 | A1 * | 10/2007 | Shim | 365/185.17 |
| 2008/0025097 | A1 | 1/2008 | Aritome | |
| 2008/0159003 | A1 | 7/2008 | Dong et al. | |
| 2008/0225589 | A1 | 9/2008 | Aritome | |
| 2009/0067248 | A1 | 3/2009 | Lee | |
| 2009/0207657 | A1 | 8/2009 | Tamada | |
| 2010/0091576 | A1 * | 4/2010 | Kwon et al. | 365/185.25 |

OTHER PUBLICATIONS

Notice of Allowance dated Sep. 19, 2013, U.S. Appl. No. 13/428,305, filed Mar. 23, 2012.

International Preliminary Report on Patentability dated May 15, 2012, International Application No. PCT/US2010/056248.

Office Action dated Jul. 13, 2012, European Patent Application No. 10784614.9.

Response to Office Action dated Jan. 21, 2013, European Patent Application No. 10784614.9.

International Search Report & The Written Opinion of the International Searching Authority dated Feb. 4, 2011, Patent Cooperation Treaty, International Application No. PCT/US2010/056248 filed Nov. 10, 2010.

* cited by examiner

| | E | A | B | C |
|---|---|---|---|---|
| XDL | 1 | 1 | 0 | 0 |
| UDL | 1 | 0 | 0 | 0 |
| LDL | 1 | 0 | 0 | 1 |

| | E | A | B | C |
|---|---|---|---|---|
| XDL | 1 | 1 | 0 | 0 |
| UDL | 1 | 1 | 0 | 0 |
| LDL | 1 | 0 | 0 | 1 |

| | E | A | B | C |
|---|---|---|---|---|
| XDL | 1 | 1 | 0 | 0 |
| UDL | 1 | 0 | 0 | 0 |
| LDL | 1 | 1 | 0 | 1 |

| | E | A | B | C |
|---|---|---|---|---|
| XDL | 1 | 1 | 0 | 0 |
| UDL | 1 | 0 | 1 | 0 |
| LDL | 1 | 1 | 0 | 1 |

| | E | A | B | C |
|---|---|---|---|---|
| XDL | 1 | 1 | 1 | 0 |
| UDL | 1 | 0 | 0 | 0 |
| LDL | 1 | 1 | 1 | 1 |

| | E | A | B | C |
|---|---|---|---|---|
| XDL | 1 | 1 | 1 | 1 |
| UDL | 1 | 0 | 0 | 0 |
| LDL | 1 | 1 | 1 | 1 |

DATA STATE-DEPENDENT CHANNEL BOOSTING TO REDUCE CHANNEL-TO-FLOATING GATE COUPLING IN MEMORY

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM. 2

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a storage element or cell with a floating gate that is used to store two ranges of charges and, therefore, the storage element can be programmed/erased between two states, e.g., an erased state and a programmed state. Such a flash memory device is sometimes referred to as a binary flash memory device because each storage element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each storage element can store two bits of data when the element can be placed in one of four discrete charge bands corresponding to four distinct threshold voltage ranges.

Typically, a program voltage Vpgm applied to the control gate during a program operation is applied as a series of pulses that increase in magnitude over time. The program voltage can be applied to a selected word line. In one possible approach, the magnitude of the pulses is increased with each successive pulse by a predetermined step size, e.g., 0.2-0.4 V. Vpgm can be applied to the control gates of flash memory elements. In the periods between the program pulses, verify operations are carried out. That is, the programming level of each element of a group of storage elements being programmed in parallel is read between successive program pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically Vpgm is applied to the control gate and the bit line is grounded, causing electrons from the channel of a storage element to be injected into the floating gate. When electrons accumulate in the floating gate, the floating gate becomes negatively charged and the threshold voltage of the storage element is raised so that it is considered to be in a programmed state.

However, electromagnetic coupling effects in memory devices are becoming increasingly important as memory device dimensions are scaled down.

DETAILED DESCRIPTION

A method and non-volatile storage system are provided in which channel boosting is optimized to counteract electromagnetic coupling effects.

Figure 1A:
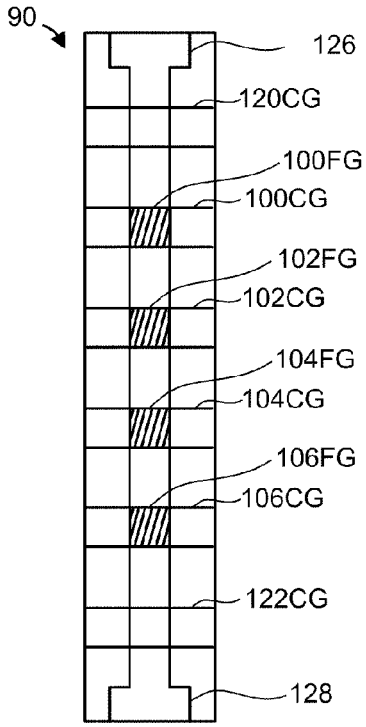
FIG. 1a is a top view of a NAND string.
Figure 1B:
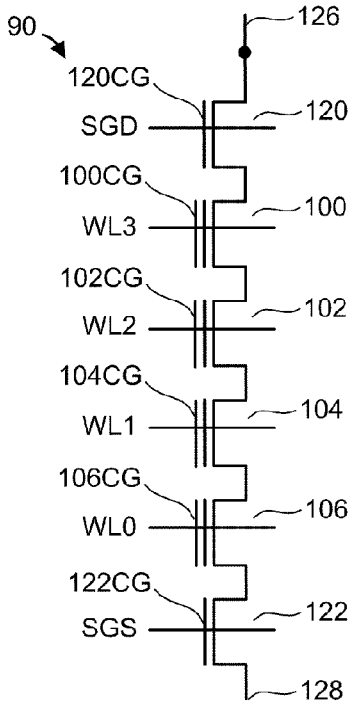
FIG. 1b is an equivalent circuit diagram of the NAND string.

During a programming operation, unselected storage elements which have previously completed programming to a target data state are inhibited from further programming by boosting associated substrate channel regions. It important for an appropriate amount of boosting to be used. If the boosting is too low, an inhibited storage element may experience program disturb, in which its threshold voltage is raised to a next higher data state, or to a level at which the storage element cannot be accurately read. On the other hand, if boosting is too high, electromagnetic coupling effects can raise the threshold voltages of the selected storage elements excessively, resulting in undesirable widening of the threshold voltage distributions. It has been determined that channel boosting levels can be tailored to the data state of an unselected storage element, so that a higher level of boosting is provided for one or more lower data states, and a lower level of boosting is provided for one or more higher data states. Various channel boosting schemes are provided using specified voltages for bit lines, drain-side select gates and/or drain-side dummy storage elements, during a period before pass voltages are applied, and/or during a period when pass voltages are applied One example of a suitable memory system uses the NAND flash memory structure, which arranges multiple transistors in series between two select gates. The transistors in series and the select gates are referred to as a NAND string. FIG. 1a is a top view showing one NAND string 90. FIG. 1b is an equivalent circuit thereof. The NAND string depicted includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gates 120 and 122 are controlled by applying the appropriate voltages to control gates 120CG and 122CG, respectively. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gates 100CG, 102CG, 104CG and 106CG are connected to word lines WL3, WL2, WL1 and WL0, respectively. In one embodiment, transistors 100, 102, 104 and 106 are each memory cells. In other embodiments, the memory cells may include multiple transistors or may be different than that depicted. Select gates 120 and 122 are connected to drain-side select line SGD and source-side select line SGS, respectively.

Figure 2:
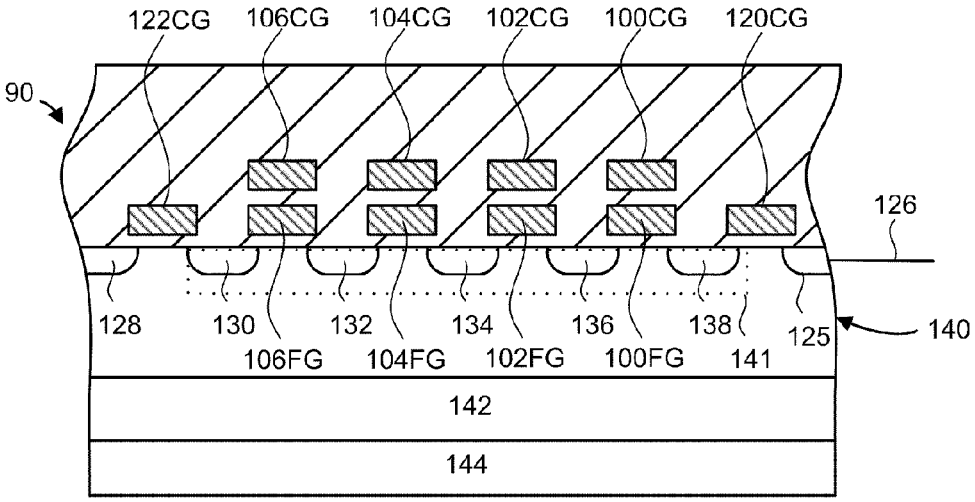
FIG. 2 is a cross-sectional view of the NAND string.

FIG. 2 provides a cross-sectional view of the NAND string described above. The transistors of the NAND string are formed in p-well region 140. The p-well region in turn may be within an n-well region 142 of a p-type substrate 144. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 125 connects to the bit line 126 for the NAND string, while N+ doped layer 128 connects to a common source line for multiple NAND strings. Some NAND strings will include 8, 16, 32, 64 or more memory cells. Each memory cell can store data represented in analog or digital form, in one or more bits.

Other types of non-volatile memory in addition to NAND flash memory can also be used.

As part of a programming operation, the potential of a channel region of the substrate which is associated with an unselected storage element and, e.g., an unselected NAND string 90, can be boosted. An unselected storage element or NAND string may be referred to as an inhibited or locked out storage element or NAND string as it is inhibited or locked out from programming in a given programming iteration of a programming operation. For example, channel region 141 may be provided in the p-well 140 of the substrate 144 when any of the storage elements which are provided by control gates and floating gates 100CG/100FG, 102CG/100FG, 104CG/104FG and 106CG/106FG is an unselected storage element in a programming operation, e.g., when the NAND string 90 is an unselected NAND string. The channel region 141 represents a conductive path in the substrate, extending in and between the doped regions 130, 132, 134, 136 and 138. Boosting can be achieved in different ways. For example, in a pre-charge operation, which occurs before a pass voltage is applied to an unselected word line, a voltage supplied on the bit line 126 can be passed to the channel 141 via the drain-side select gate transistor 120CG. In one possible scenario, with an appropriate bit line voltage, the drain-side select gate transistor provides a voltage of Vcg-Vth to the channel, where Vcg is the control gate voltage, and Vth is the threshold voltage, of the drain-side select gate transistor. The drain-side select gate transistor may subsequently be rendered non-conductive so that the bit line is cutoff from the channel 141, and the boosted potential is maintained in the channel. Channel boosting can also be achieved by applying pass voltages to the word line and maintaining the drain-side select gate transistor non-conductive. The pass voltages couple to the channel, raising its potential. Various channel boosting schemes are discussed in detail further below.

Figure 3:
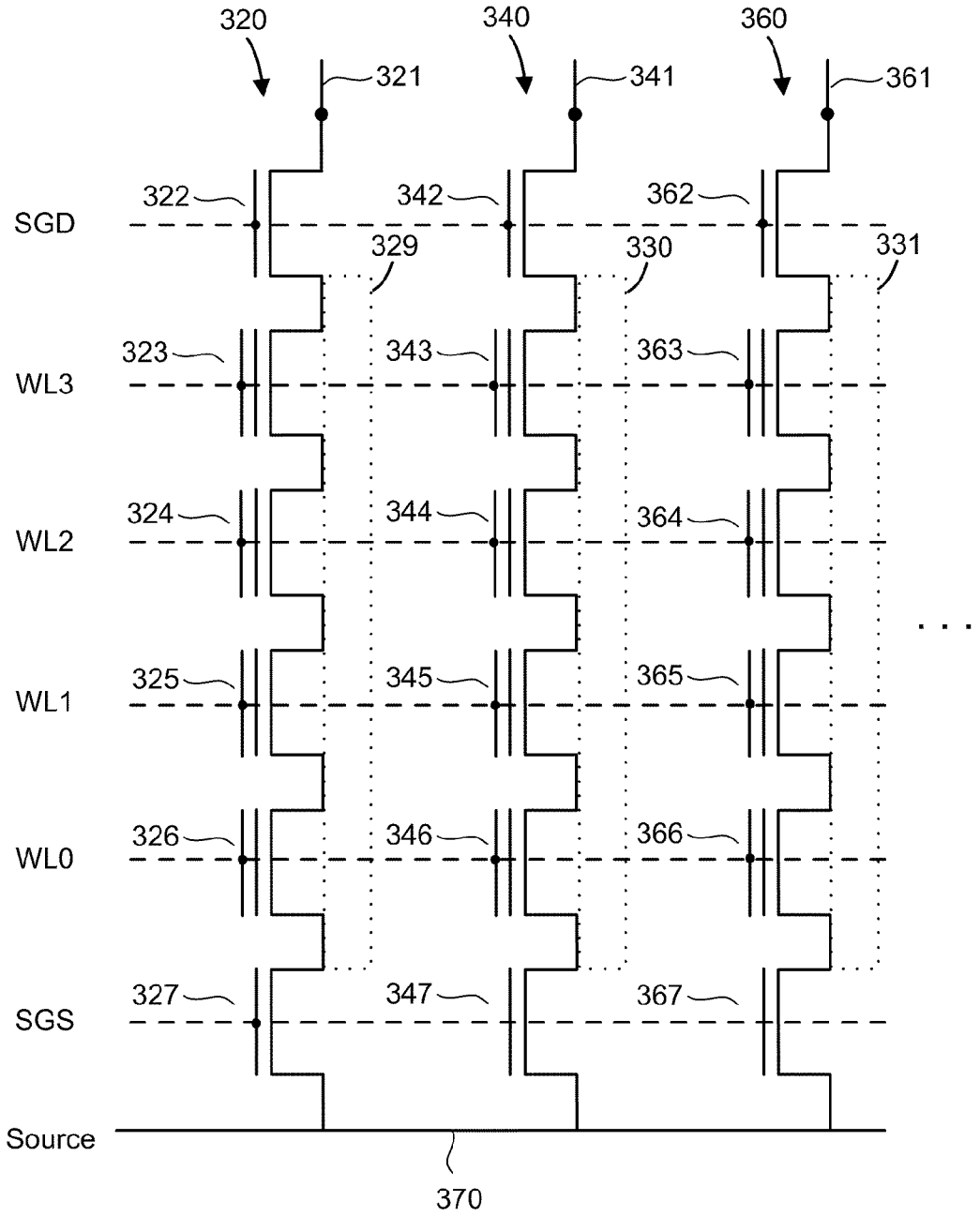
FIG. 3 is a circuit diagram depicting three NAND strings.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line 370 by its select gates (e.g., select gates 327, 347 or 367). A selection line SGS is used to control the source side select gates. The various NAND strings 320, 340 and 360 are connected to respective bit lines 321, 341 and 361, by drain-side select transistors in the select gates 322, 342, 362, respectively. These select transistors are controlled by a drain select line SGD. In other embodiments, the select lines do not necessarily need to be in common among the NAND strings; that is, different select lines can be provided for different NAND strings. Example channel regions 329, 330 and 331 which are associated with the NAND strings 320, 340 and 360, respectively, may be created in the substrate. Note that the storage elements and channel regions are depicted as if they were rotated 90 degrees from their actual position.

Word lines are connected to the control gates for storage elements as follows: WL3 (storage elements 323, 343 and 363), WL2 (storage elements 324, 344 and 364), WL1 (storage elements 325, 345 and 365), and WL0 (storage elements 326, 346 and 366). Each word line connects the control gates of each storage element in the row. Or, the control gates may be provided by the word lines themselves.

When programming a flash storage element, a program voltage is applied to the control gate of the storage element, e.g., via an associated word line, and the bit line associated with the storage element is grounded. Electrons from the channel are injected into the floating gate. When electrons accumulate in the floating gate, the floating gate becomes negatively charged and the Vth of the storage element is raised.

Figure 4:
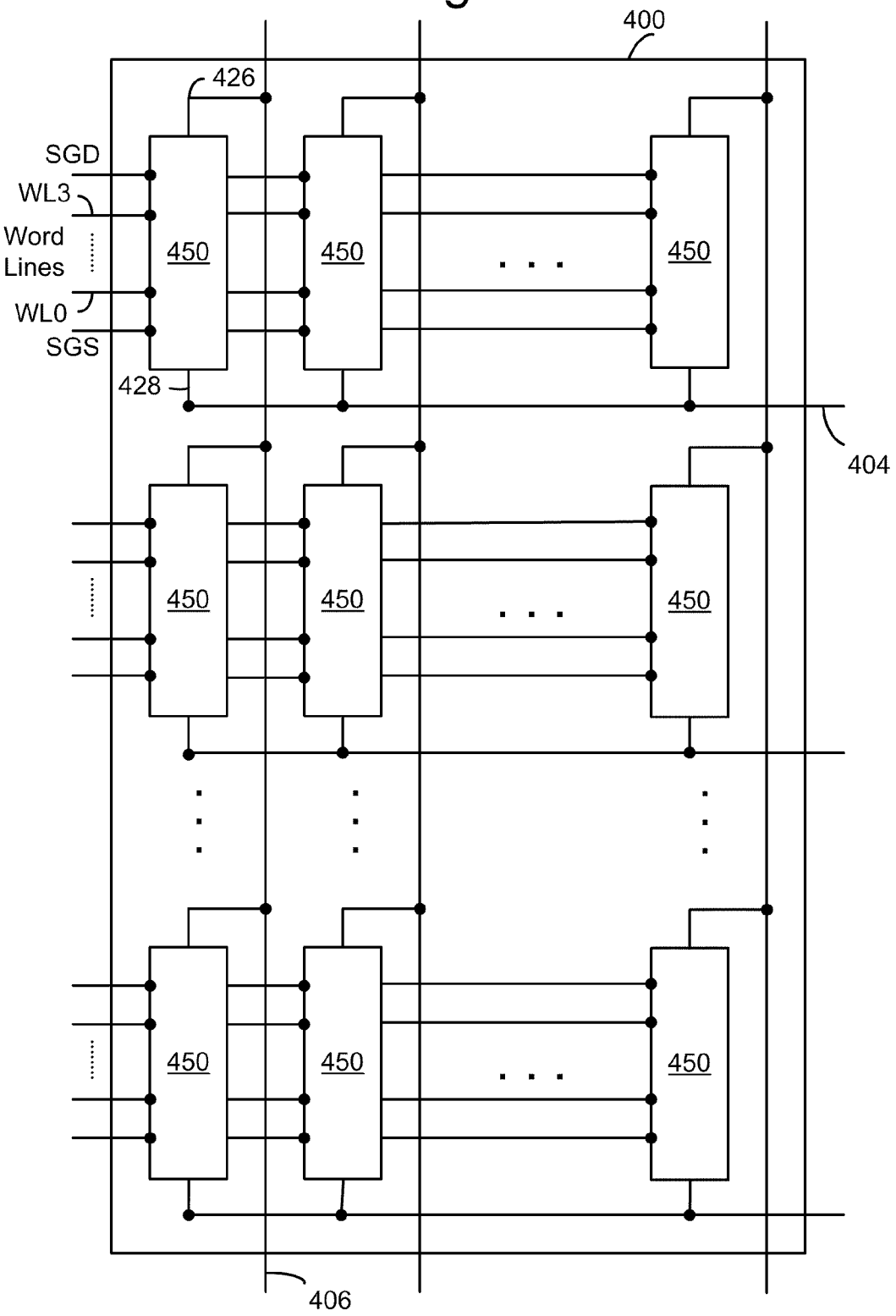
FIG. 4 is a block diagram of an array of NAND flash storage elements.

FIG. 4 illustrates an example of an array 400 of NAND storage elements, such as those shown in FIGS. 1a and 1b. Along each column, a bit line 406 is coupled to the drain terminal 426 of the drain-side select gate for the NAND string 450. Along each row of NAND strings, a source line 404 may connect all the source terminals 428 of the source select gates of the NAND strings.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. A large number of pages form a block, anywhere from 8 pages, for example, up to 32, 64, 128 or more pages. In some embodiments, a row of NAND strings comprises a block.

Figure 5:
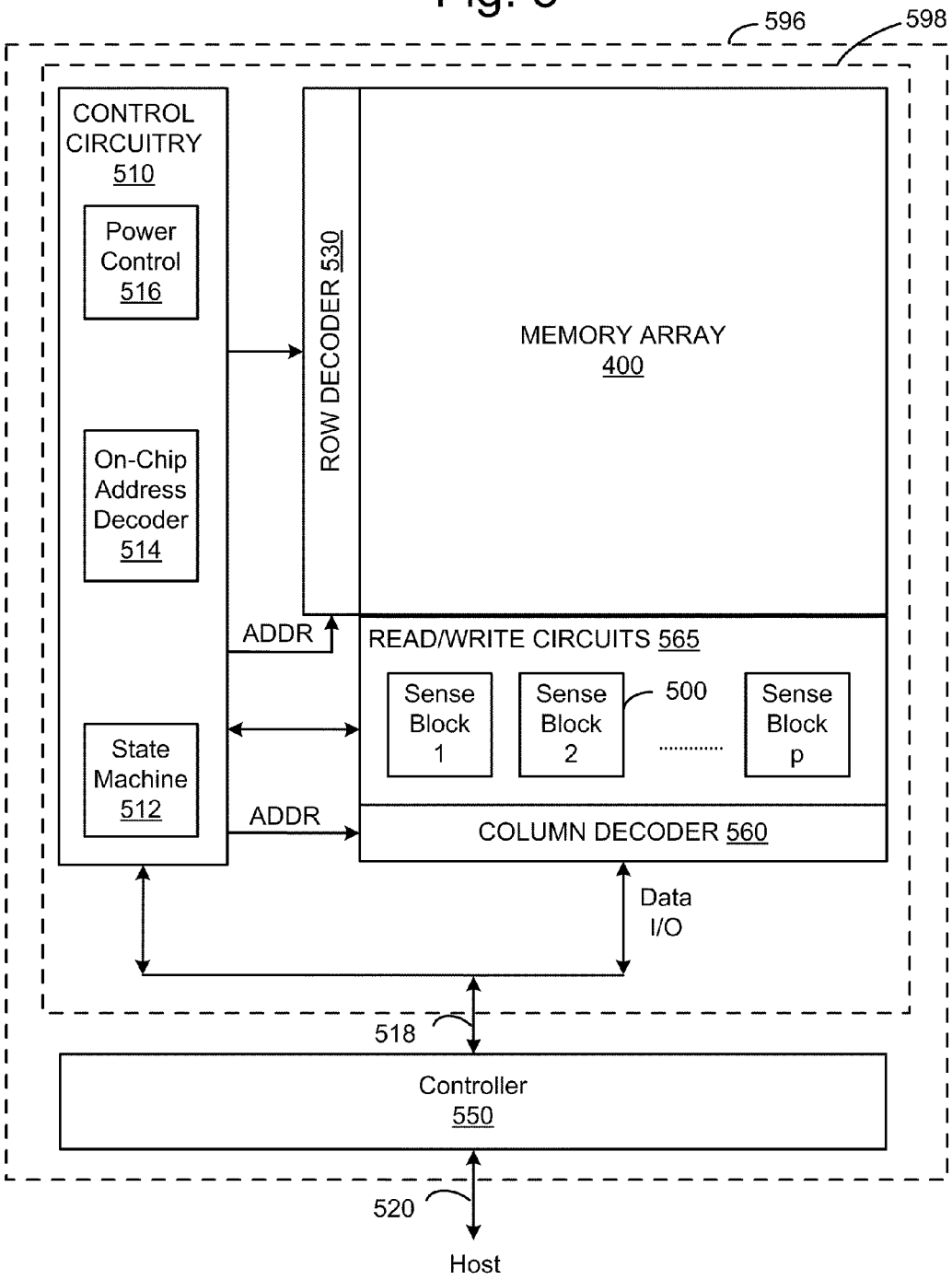
FIG. 5 is a block diagram of a non-volatile memory system using single row/column decoders and read/write circuits.

FIG. 5 is a block diagram of a non-volatile memory system using single row/column decoders and read/write circuits. A memory device 596 having read/write circuits for reading and programming a page of storage elements in parallel, according to one embodiment. Memory device 596 may include one or more memory die 598. Memory die 598 includes a two-dimensional array of storage elements 400, control circuitry 510, and read/write circuits 565. In some embodiments, the array of storage elements can be three dimensional. The memory array 400 is addressable by word lines via a row decoder 530 and by bit lines via a column decoder 560. The read/write circuits 565 include multiple sense blocks 500 and allow a page of storage elements to be read or programmed in parallel. Typically a controller 550 is included in the same memory device 596 (e.g., a removable storage card) as the one or more memory die 598. Commands and data are transferred between the host and controller 550 via lines 520 and between the controller and the one or more memory die 598 via lines 518.

The control circuitry 510 cooperates with the read/write circuits 565 to perform memory operations on the memory array 400. The control circuitry 510 includes a state machine 512, an on-chip address decoder 514, and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations.

In some implementations, some of the components of FIG. 5 can be combined. In various designs, one or more of the components (alone or in combination), other than storage element array 400, can be thought of as a managing or control circuit. For example, one or more managing or control circuits may include any one of or a combination of control circuitry 510, state machine 512, decoders 514/560, power control 516, sense blocks 500, read/write circuits 565, controller 550, and so forth.

In another embodiment, a non-volatile memory system uses dual row/column decoders and read/write circuits. Access to the memory array 400 by the various peripheral circuits is implemented in a symmetric fashion, on opposite sides of the array.

Figure 6:
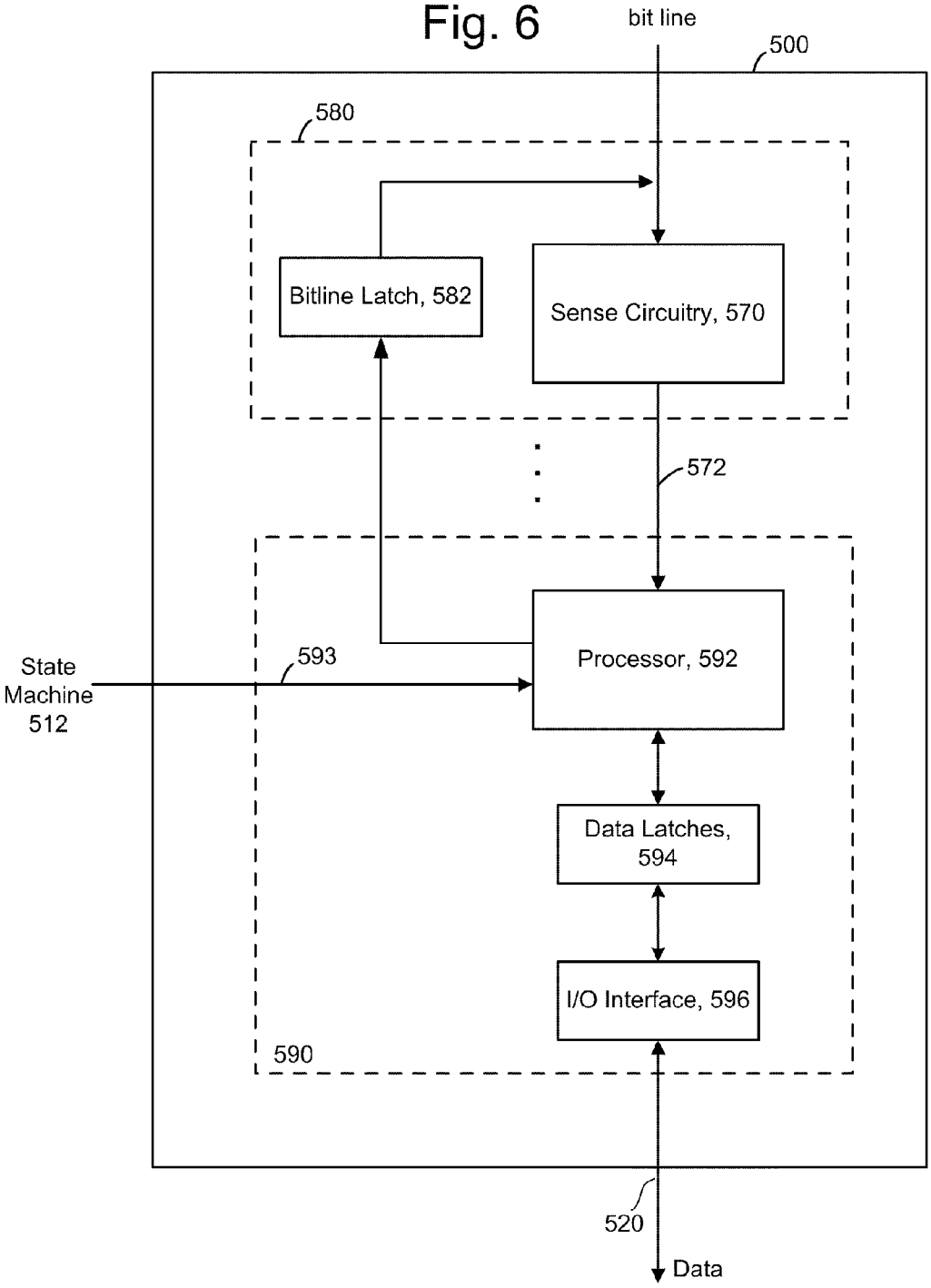
FIG. 6 is a block diagram depicting one embodiment of a sense block.

FIG. 6 is a block diagram depicting one embodiment of a sense block. An individual sense block 500 is partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 will result in the connected bit line being pulled to a state designating program inhibit (e.g., 1.5-3 V).

Common portion 590 comprises a processor 592, a set of data latches 594 and an I/O Interface 596 coupled between the set of data latches 594 and data bus 520. Processor 592 performs computations. For example, one of its functions is to determine the data stored in the sensed storage element and store the determined data in the set of data latches. See also FIGS. 12 and 13a-f. The set of data latches 594 is used to store data bits determined by processor 592 during a read operation. It is also used to store data bits imported from the data bus 520 during a program operation. The imported data bits represent write data meant to be programmed into the memory. I/O interface 596 provides an interface between data latches 594 and the data bus 520.

During reading or other sensing, a state machine 512 controls the supply of different control gate voltages to the addressed storage element. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During program or verify, the data to be programmed is stored in the set of data latches 594 from the data bus 520. The program operation, under the control of the state machine, comprises a series of programming voltage pulses applied to the control gates of the addressed storage elements. Each program pulse is followed by a read back (verify) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to the read/write block of m storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 7A:
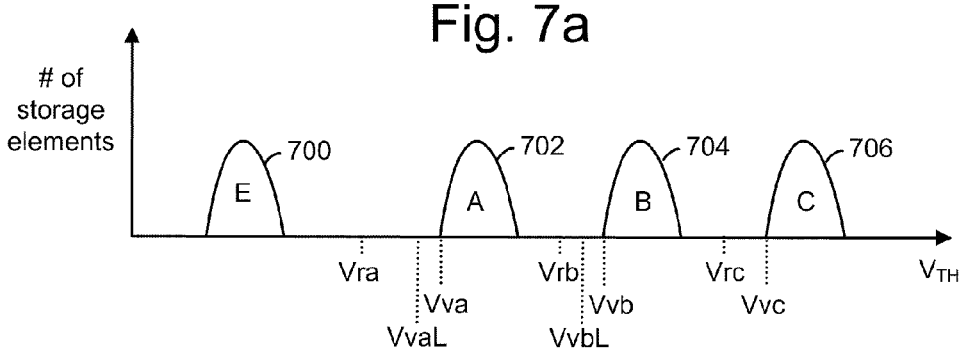
FIG. 7a depicts an example set of threshold voltage distributions.

FIG. 7a depicts an example set of threshold voltage distributions for a four-state memory device in which each storage element stores two bits of data. A first threshold voltage (Vth) distribution 700 is provided for erased (E-state) storage elements. Three Vth distributions 702, 704 and 706 represent programmed states A, B and C, respectively. In one embodiment, the threshold voltages in the E-state and the threshold voltages in the A, B and C distributions are positive.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

Figure 8:
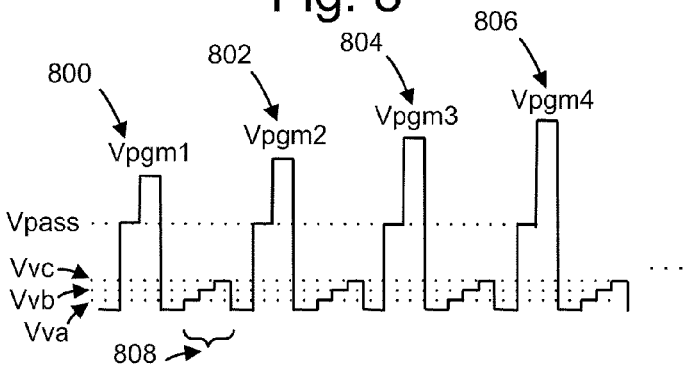
FIG. 8 depicts a series of program and verify pulses which are applied to a selected word line during a programming operation.

In one embodiment, known as full sequence programming, storage elements can be programmed from the E-state directly to any of the programmed states A, B or C. For example, a population of storage elements to be programmed may first be erased so that all storage elements in the population are in the E-state. A series of program pulses such as depicted in FIG. 8 will then be used to program storage elements directly into states A, B or C. While some storage elements are being programmed from the E-state to the A-state, other storage elements are being programmed from the E-state to the B-state and/or from the E-state to the C-state.

Another option is to use low and high verify levels for one or more data states. For example, VvaL and Vva are lower and higher verify levels, respectively, for the A-state, and VvbL and Vvb are lower and higher verify levels, respectively, for the B-state. During programming, when the Vth of a storage element which is being programmed to the A-state as a target state exceeds VvaL, the programming speed of the storage element is slowed down, in a slow programming mode, such as by raising the associated bit line voltage to a level, e.g., 0.6-0.8 V, which is between a nominal program or non-inhibit level, e.g., 0 V and a full inhibit level, e.g., 4-6 V. This provides greater accuracy by avoiding large step increases in threshold voltage. When the Vth reaches Vva, the storage element is locked out from further programming. Similarly, when the Vth of a storage element which is being programmed to the B-state as a target state exceeds VvbL, the programming speed of the storage element is slowed down, and when the Vth reaches Vvb, the storage element is locked out from further programming. This programming technique has been referred to as a quick pass write or dual verify technique. Note that, in one approach, dual verify levels are not used for the highest state since some overshoot is typically acceptable for that state. Instead, the dual verify levels can be used for the programmed states, above the erased state, and below the highest state.

Figure 7B:
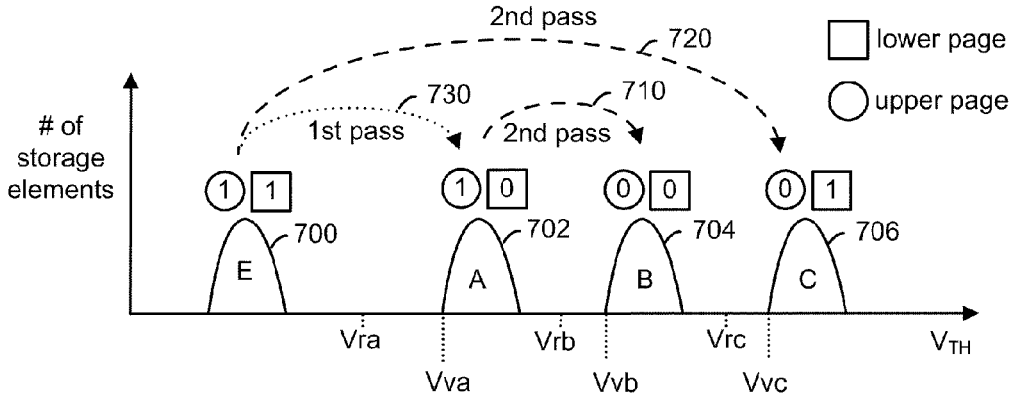
FIG. 7b depicts an example set of threshold voltage distributions and two-pass programming.

FIG. 7b illustrates an example of a two-pass technique of programming a multi-state storage element that stores data for two different pages: a lower page and an upper page. Four states are depicted by repeating the threshold voltage distributions 800, 802, 804 and 806 from FIG. 7a. These states, and the bits they represent, are: E-state (11), A-state (10), B-state (00) and C-state (01). For E-state, both pages store a "1." For A-state, the lower page stores a "0" and the upper page stores a "1." For B-state, both pages store "0." For C-state, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be A-state, as shown by arrow 900. That concludes the first programming pass.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the E-state, then in the second phase the storage element is programmed so that the threshold voltage is increased to be within C-state, as depicted by arrow 920. If the storage element had been programmed into A-state as a result of the first programming pass, then the storage element is further programmed in the second pass so that the threshold voltage is increased to be within B-state, as depicted by arrow 910. The result of the second pass is to program the storage element into the state designated to store a logic "0" for the upper page without changing the data for the lower page.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements.

In another possible programming technique, in a first step, the lower page is programmed. If the lower page is to remain data 1, then the storage element state remains at E-state. If the data is to be programmed to 0, then the threshold of voltage of the storage element is raised such that the storage element is programmed to an intermediate distribution which extends between states A and B.

In programming the upper page, if the storage element is in the E-state and the upper page is to remain at 1, then the storage element will remain in E-state. If the storage element is in E-state and its upper page data is to be programmed to 0, then the threshold voltage of the storage element will be raised so that the storage element is in A-state. If the storage element was in intermediate threshold voltage distribution 1012 and the upper page data is to remain at 1, then the storage element will be programmed to target B-state. If the storage element is in the intermediate threshold voltage distribution and the upper page data is to become data 0, then the threshold voltage of the storage element will be raised so that the storage element is in C-state.

Although the programming examples depict four data states and two pages of data, the concepts taught can be applied to other implementations with more or fewer than four states and more or fewer than two pages. For example, memory devices with eight or sixteen states per storage element are currently planned or in production.

Moreover, in the example programming techniques discussed, the Vth of a storage element is raised gradually as it is programmed to a target data state. However, programming techniques can be used in which the Vth of a storage element is lowered gradually as it is programmed to a target data state. Programming techniques which measure storage element current can be used as well. The concepts herein can be adapted to the different programming techniques.

FIG. 8 depicts a series of program and verify pulses which are applied to a selected word line during a programming operation. A programming operation may include multiple programming iterations, where each iteration applies a program voltage followed by verify voltages, to a selected word line. In one possible approach, the program voltages are stepped up in successive iterations. Moreover, the program voltages may include a first portion which has a pass voltage (Vpass) level, e.g., 6-8 V, followed by a second portion to a program level, e.g., 12-25V. For example, a first, second, third and fourth program pulses 800, 802, 804 and 806 have program voltages of Vpgm1, Vpgm2, a Vpgm3 and Vpgm4, respectively, and so forth. One or more verify voltages, such as example verify voltages Vva, Vvb and Vvc (808), may be provided after each program pulse. In some cases, one or more initial program pulses are not followed by verify pulses because it is not expected that any storage elements have reached the lowest program state (e.g., A-state). Subsequently, program iterations may use verify pulses for the A-state, followed by program iterations which use verify pulses for the A- and B-states, followed by program iterations which use verify pulses for the B- and C-states, for instance.

Figure 9:
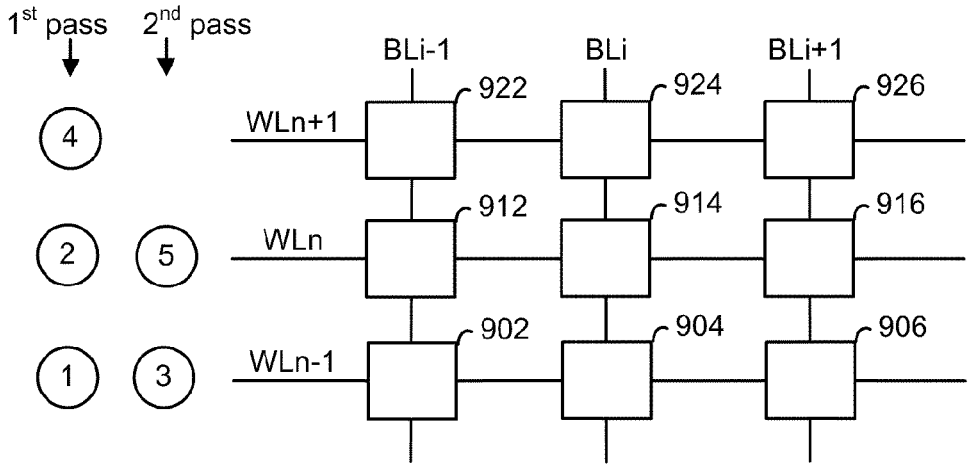
FIG. 9 depicts a multi-pass program operation for a set of storage elements.

FIG. 9 depicts a multi-pass program operation for a set of storage elements. The components depicted may be a subset of a much larger set of storage elements, word lines and bit lines. In one possible program operation, storage elements on WLn−1, e.g., storage elements 902, 904 and 906, are programmed in a first programming pass. This step is represented by the circled "1." Next ("2"), storage elements on WLn, e.g., storage elements 912, 914 and 916, are programmed in a first programming pass. In this example, when a word line is selected for programming, verify operations occur after each program pulse. During the verify operations on WLn, one or more verify voltages are applied to WLn and pass voltages are applied to the remaining word lines including WLn−1 and WLn+1. The pass voltages are used to turn on (make conductive) the unselected storage elements so that a sensing operation can occur for the selected word line. Next ("3"), storage elements on WLn−1 are programmed in a second programming pass. Next ("4"), storage elements on WLn+1 are programmed in a first programming pass. Next ("5"), the storage elements on WLn are programmed in a second programming pass to their respective target states.

Figure 10:
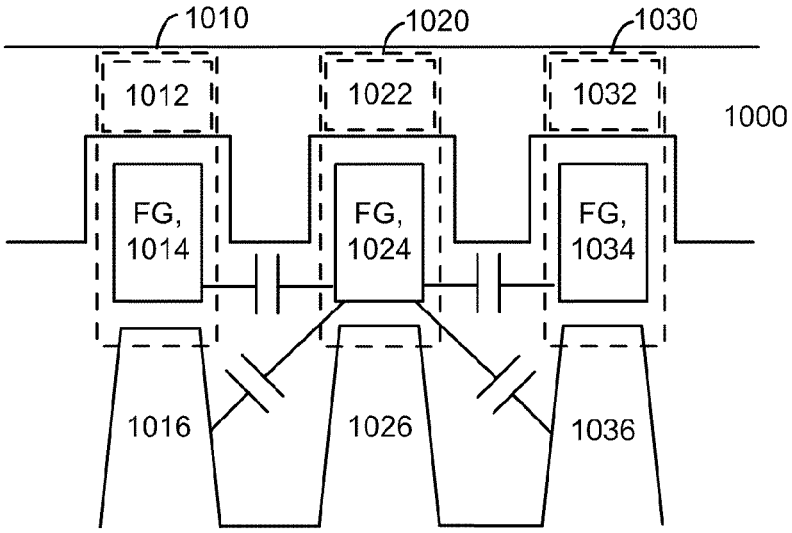
FIG. 10 depicts a cross-sectional view of NAND strings showing channel-to-floating gate coupling and floating gate-to-floating gate coupling.

FIG. 10 depicts a cross-sectional view of NAND strings showing channel-to-floating gate coupling and floating gate-to-floating gate coupling. A bit line or NAND string direction goes into the page, and a word line direction goes from left to right. A word line 1000 extends across multiple NAND strings. A first NAND string includes a channel region 1016. A storage element 1010 in the first NAND string includes a control gate 1012, which is a portion of the word line 1000, and a floating gate 1014. A second NAND string includes a channel region 1026. A storage element 1020 in the second NAND string includes a control gate 1022, which is a portion of the word line 1000, and a floating gate 1024. A third NAND string includes a channel region 1036. A storage element 1030 in the third NAND string includes a control gate 1032, which is a portion of the word line 1000, and a floating gate 1034.

As memory devices are scaled down, storage element-to-storage element interferences play an increasingly important role. One of these interferences is channel-to-floating gate coupling during programming. In all-bit line programming, consider a selected storage element 1020 of a selected word line which undergoes programming. When a storage element (e.g., 1010 or 1030) of a neighbor bit line, on the same word line 1000, reaches its target data state, it is locked out or inhibited from further programming. In the next program iteration, a substrate channel region (e.g., 1016 or 1036) of the locked out storage element is boosted to prevent the floating gate (e.g., 1014 or 1034) of the storage element from being increased when a program pulse is applied to the selected word line. However, the boosted potential in the channel couples up to the floating gate 1024 of the selected storage element 1020, leading to an increase in the effective program voltage (Vpgm) which is seen by the selected storage element when a program pulse is applied. This results in a larger jump in the Vth of the selected storage element than is desired. The Vth distributions of the storage elements are therefore widened undesirably. In addition to this channel-to-floating gate coupling, floating gate-to-floating gate can also increase the effective Vpgm which is seen by a selected storage element. This is represented by coupling from floating gates 1014 and/or 1034 to floating gate 1024.

Moreover, if both of the adjacent neighbor storage elements of a selected storage element lock out together, then during the next program iteration their channels will both be inhibited. The neighbor channels (e.g., 1016 and 1036) will be boosted to Vchannel, so that their floating gates (e.g., 1014 and 1034) are also boosted to a higher potential. Whenever a channel is boosted, a part of Vchannel gets coupled to the floating gate and hence raises the floating gate potential. For example, about 15% of Vchannel in the neighbor channels 1016 and 1036 may be coupled to the floating gates 1014 and 1034, respectively. Both Vchannel and the neighbor floating gate potential couple up to the floating gate 1024 of the selected storage element and increase the effective Vpgm. The amount of coupling depends on Vchannel, coupling from the channel (1016 and/or 1036) to the floating gate (1014 and/or 1034), and coupling from the floating gates 1014 and/or 1034 to the floating gate 1024.

There is a conflict in that a sufficient amount of boosting is needed to prevent program disturb on locked out storage elements, but too much boosting causes Vth distribution widening. However, channel boosting can be set based on data states of the locked out storage elements so that boosting is only as high as needed. In particular, a higher Vchannel is needed to inhibit E-state storage elements to reduced E→A failures, which can happen if the floating gate of an E-state storage element receives additional electrons due to program disturb so that its Vth is raised above the E-state distribution and into the A-state distribution. Since an E-state storage element has a low Vth and thus a relatively higher floating gate potential, it requires a relatively higher Vchannel to reduce floating gate to the channel electric field in order to prevent electrons from being injected into the floating gate. On the other hand, for programmed states (such as A-, B- and C-states) since the floating gate potential is relatively lower, it is harder for electrons to be injected into the floating gate, so that the Vchannel required to inhibit the storage elements is substantially lower. By selectively boosting the channels of locked out storage elements that have higher, programmed states to a lower Vchannel level than locked out storage elements that have an erased state or lower, programmed states, undesirable coupling effects can be reduced while still providing a sufficient amount of boosting to prevent program disturb. Generally, program disturb is most problematic for the storage elements of a currently selected word line since it receives the high program voltage Vpgm.

Other approaches for reducing coupling include programming even and odd bit lines separately so that for each storage element, the neighbor storage element or a neighbor bit line is always in an inhibit state. While this scheme is effective, it has a significant performance penalty as programming time is increased. Another approach is to float the bit lines and channels for the still-programming storage elements. In case a neighbor storage element locks out, the floated bit line and channel couples up to a higher value that slows down programming of the storage element and hence self-compensates for the coupling. However, this approach also increases programming time.

In a proposed approach, the boost potential for inhibited higher state storage elements (such as A-, B- and C-states) of a currently selected word line is reduced by suppressing or blocking the pre-charge for those channels and/or by reducing the effective Vpass for those channels. This approach reduces coupling experienced by selected storage elements and can lead to tighter Vth distributions, resulting in better endurance and/or better performance. A general goal is to reduce the channel boost voltage as much as possible, based on a data state of an inhibited storage element of the channel, without encouraging program disturb.

Figure 11:
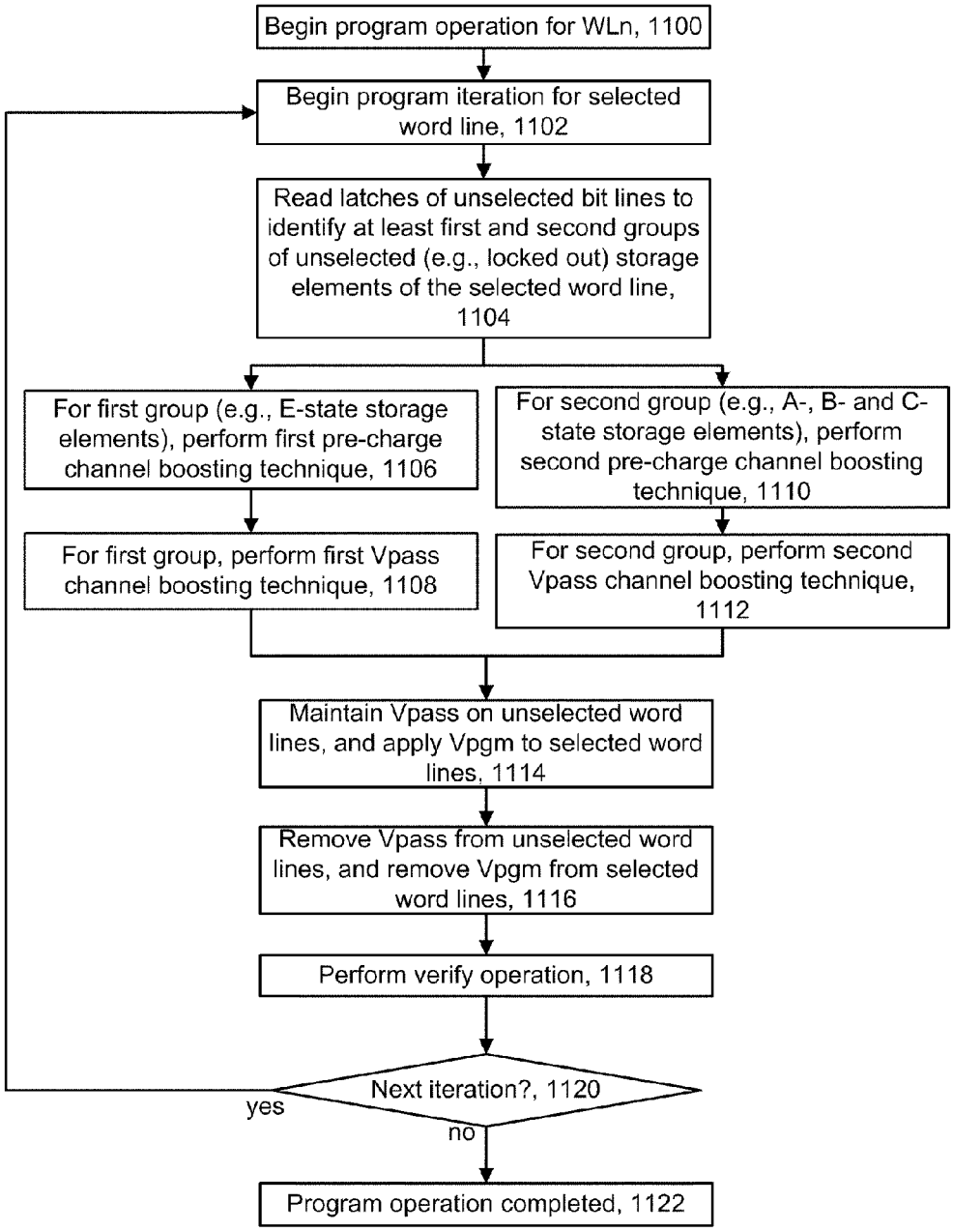
FIG. 11 depicts a process for programming selected storage elements while using different boosting schemes for locked out storage elements according to their data states.

FIG. 11 depicts a process for programming selected storage elements while using different boosting schemes for locked out storage elements according to their data states. At step 1100, a program operation begins for a selected word line WLn. At step 1102, a program iteration begins. At step 1104, latches of the unselected bit lines are read to identify at least first and second groups of unselected storage elements of the selected word line. An unselected bit line is a bit line associated with an unselected storage element of a selected word line. Here, an unelected storage element refers to a storage element that has reached its target data state and is being inhibited from further programming. For example, a set of storage elements may be associated with WLn, a first subset of storage elements of the set may include unselected E-state storage elements, which are in the first group. Note that an E-state storage element is typically unselected at the start of programming. A second subset of storage elements of the set may include unselected A-, B- and C-state storage elements. This grouping is efficient as it treats the E-state storage elements which are most susceptible to program disturb, separately from the programmed state storage elements. Moreover, treating the programmed state storage elements similarly can yield good results. It is also possible to have three or more groups. In one possible approach, a separate group is provided for each data state, to allow the channel boosting to be tailored for each data state.

In an example with eight data states, e.g., states E and A-G, a first group could include the E-state, a second group could include lower programmed states such as A-C and a third group could include higher programmed states such as D-G. The optimal number of groups, and the data states which are assigned to each group can be determined for a specific memory device. Although having more groups tends to improve the effectiveness of the scheme, it can also result in increased overhead costs and programming time. Moreover, the number of groups which can be identified may be limited by the number of latches which are associated with each bit line, as discussed further in connection with FIG. 12.

Steps 1106 and 1110 can occur in parallel, at least in part, as can steps 1108 and 1112. At step 1106, a first channel pre-charge boosting technique is performed for the first group of unselected storage elements. At step 1110, a second channel pre-charge boosting technique is performed for the second group of unselected storage elements. Various techniques, discussed further below, can be used to achieve different channel pre-charge boosting levels. Pre-charge boosting can include boosting which occurs by supplying a voltage to the channel via the bit line, usually prior to application of Vpass to the word lines. At step 1108, a first Vpass channel boosting technique is performed, and at step 1112, a second Vpass channel boosting technique is performed. These involve channel boosting via the use of pass voltages which are applied to the selected and unselected word lines, e.g., to all word lines associated with a set of storage elements.

In one approach, different pre-charge channel boosting techniques are performed and a common Vpass boosting technique is performed, for the different groups of unselected storage elements. In another approach, a common pre-charge channel boosting technique (or no pre-charge channel boosting technique) is performed, and different Vpass boosting techniques are performed, for the different groups of unselected storage elements. Vpass boosting can boost the channel regions of the first and second groups beyond the pre-charge levels which were achieved in steps 1106 and 1110. At step 1114, Vpass is maintained on the unselected word lines while Vpgm is applied to the selected word line. Vpgm provides some additional boosting to the channels but to a smaller degree than Vpass, since Vpgm is only applied to one word line while Vpass is typically applied to all word lines. At step 1116, Vpass is removed from the unselected word lines, and Vpgm is removed from the selected word line. At step 1118, one or more verify operations are performed to determine whether the selected storage elements have reached their target data states. At decision step 1120, if a next program iteration is to be performed, the process continues at step 1102. If there is no next program iteration, the program operation is completed at step 1122.

Figures 12, 13A, 13B, 13C, 13D, 13E, 13F:
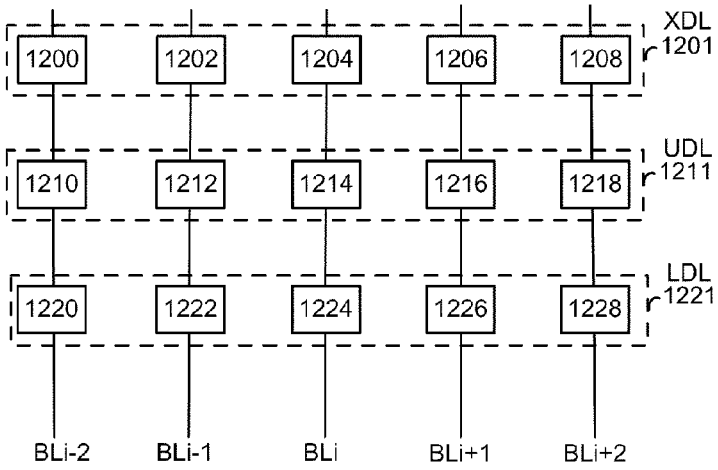
FIG. 12 depicts the use of data latches for respective bit lines.
FIGS. 13a-f depict example latch values which allow locked out E-state storage elements to be distinguished from locked out A-, B- and C-state storage elements.

FIG. 12 depicts the use of data latches for respective bit lines. Generally, one or more data latches, each storing one bit of data, can be provided for each bit line. The latches identify when an associated storage element has reached certain mileposts in a programming operations. For example, latches may identify that a storage element has not yet completed programming (e.g., its Vth is below a verify level such as Vva, Vvb or Vvc in FIG. 7a), or has completed programming (e.g., its Vth is above a verify level). Latches may also identify that storage element's Vth is below a lower verify level (e.g., VvaL or VvbL in FIG. 7a), is above a lower verify level (e.g., VvaL or VvbL) but below a higher or target verify level (e.g., Vva, Vvb or Vvc), e.g., in a slow programming mode, or is above the higher or target verify level.

A first set of latches 1201, referred to as XDL latches, includes latches 1200, 1202, 1204, 1206 and 1208. The XDL latches can be used to store a lower page of data, for instance. An XDL latch is flipped when a lower page bit is stored in an associated storage element. A second set of latches 1211, referred to as UDL latches, includes latches 1210, 1212, 1214, 1216 and 1218. A UDL latch is flipped when an associated storage element is in a slow programming mode, e.g., when its Vth is between lower and target verify levels. A third set of latches 1221, referred to as LDL latches, includes latches 1220, 1222, 1224, 1226 and 1228. The latches are connected to representative bit lines BLi−2, BLi−1, BL, BLi+1 and BLi+2. The LDL latches can be used to store an upper page of data, for instance. An LDL latch is flipped when an associated storage element completes programming, e.g., when its Vth exceeds a target verify level such as Vva, Vvb or Vvc.

In some detection schemes, once any storage element is locked out, all the data latches (XDL, LDL, UDL) for that storage element set to "1". However, this does not allow distinguishing between storage elements which have been locked out at different data states. For example, an E-state storage element cannot be distinguished form an A-, B- or C-state storage element. To implement a data state-dependent boosting scheme in existing memory devices, an extra data latch, or a modified detection scheme as provided herein can be used. Or, a new memory device can have such capabilities designed in from the start.

As mentioned, when a slow programming technique is used, the UDL latch stores information about whether the associated storage element has passed a lower verify level such as VvaL or VvbL. When the Vth of the associated storage element passes the lower verify level, the corresponding UDL latch is flipped to "1," indicating that the slow programming mode has been entered, and kept that way until the page finishes programming. However, once a particular storage element has passed both the lower and upper verify levels, the other two data latches (LDL and UDL) corresponding to that storage element are also flipped to "1". After this point, it is unnecessary for the UDL latch for that storage element to be maintained at "1". Hence, we can reset those UDL latches to "0" once the storage elements have passed the respective target verify level, and exited the slow programming mode. Further, if a storage element is in the E-state, XDL, LDL and UDL are "1," and if a storage element is in the inhibited A-, B- or C-state, it will have XDL=1, LDL=1 and UDL=0. In order for this scheme to work in existing memory device, slow programming lockout and program-verify equations can be modified.

FIGS. 13a-f depict example latch values which allow locked out E-state storage elements to be distinguished from locked out A-, B- and C-state storage elements. One example implementation is depicted, as variations are possible. An implementation for a particular memory device should account for factors such as the number of available latches, whether slow programming is used, and the number of groups of data states which are to be distinguished from one another.

FIG. 13a depicts the bit values for each latch according to the target data state of the associated storage element at the start of programming. For an E-state storage element, all latches are set to 1. For an A-state storage element, the XDL, UDL and LDL latches are set to 1, 0 and 0, respectively. For a B-state storage element, all latches are set to 0. For a C-state storage element, the XDL, UDL and LDL latches are set to 0, 0 and 1, respectively.

FIG. 13b depicts the bit values for each latch according to the target data state of the associated storage element after the Vth of an A-state storage element has passed the lower verify level VvaL. The UDL bit is flipped to 1. The changes in the data latches are made at the end of each programming iteration, after verify operations are performed.

FIG. 13c depicts the bit values for each latch according to the target data state of the associated storage element after the Vth of an A-state storage element has passed the target verify level Vva. The UDL bit is flipped to 0 and the LDL bit is flipped to 1.

FIG. 13d depicts the bit values for each latch according to the target data state of the associated storage element after the Vth of a B-state storage element has passed the lower verify level VvbL. The UDL bit is flipped to 1.

FIG. 13e depicts the bit values for each latch according to the target data state of the associated storage element after the Vth of a B-state storage element has passed the target verify level Vvb. The XDL bit is flipped to 1, the UDL bit is flipped to 0 and the LDL bit is flipped to 1.

FIG. 13f depicts the bit values for each latch according to the target data state of the associated storage element after the Vth of a C-state storage element has passed the target verify level Vvc. The XDL bit is flipped to 1. At the end of the programming operation for a storage element, the sequence of XDL, UDL and LDL bits for the E-state storage elements is 1, 1, 1 and the sequence of XDL, UDL and LDL bits for the A-, B- and C-state storage elements is 1, 0, 1. As a result, a control circuit of the memory device can read the latches at the start of each program iteration to distinguish the E-state storage elements from the locked out A-, B- and C-state storage elements, and initiate a corresponding boosting procedure which is tailored to a data state or group of data states. This is in contrast to other approaches in which all latches look the same (e.g., 1, 1, 1) after lockout and do not identify the data state or group of data states. Moreover, the approach provided herein re-uses the UDL latch once it is no longer needed. That is, once a storage element locks out after being in a slow programming mode, the UDL bit corresponding to that storage element is no longer relevant and can be used for other purposes.

Figure 14:
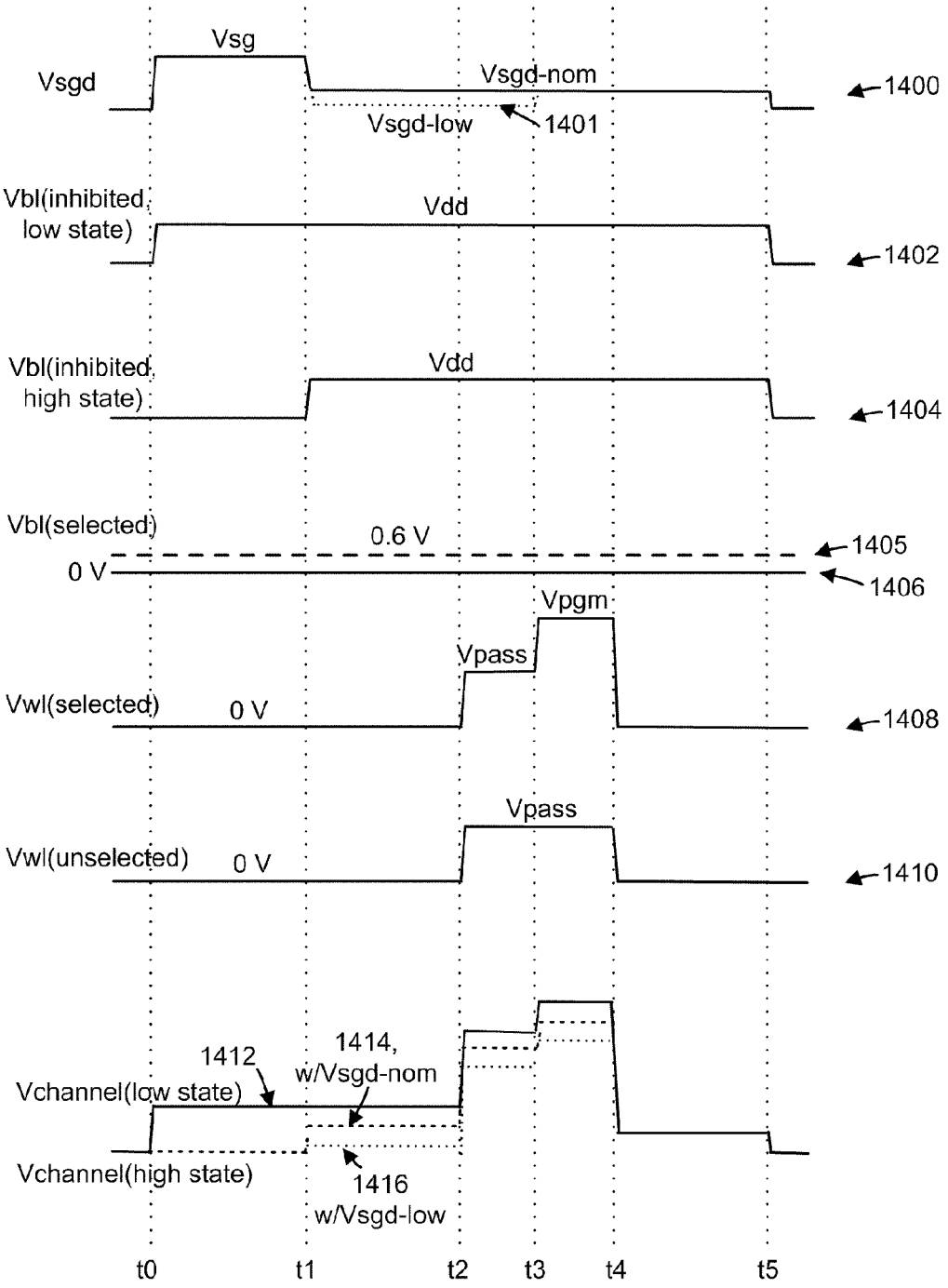
FIG. 14 depicts a first boosting technique.

FIG. 14 depicts a first channel boosting technique. The waveforms in the figures herein are not necessarily to scale. As mentioned, it is desirable to provide a data state-dependent channel boosting for the unselected storage elements so that they are boosted at an optimal level to prevent or reduce program disturb while avoiding excessive coupling which can raise the Vth of the selected storage elements. Generally, channel boosting can be provided via the use of specified voltages for bit lines, drain-side select gates and/or drain-side dummy storage elements, during a period before pass voltages are applied (also referred to as a pre-charge period), and/or during a period when pass voltages are applied. In this example, the period t0-t2 represents boosting via the use of specified voltages for bit lines and drain-side select gates, during a period before pass voltages are applied, and the period t2-t4 represents boosting during a period when pass voltages are applied.

Pre-charge of a channel can occur when the bit line communicates with the channel. A transistor is conductive between its source and drain when the gate voltage, Vsgd, exceeds the lower of the source and drain voltages by the Vth of the transistor. In one case, Vsgd=Vsg>Vbl+Vth, and most of Vbl is passed to the channel as the drain-to-source path of the transistor remains conductive. For example, the channel potential may be 0.3-0.5 V less than Vbl. As an example, the drain (at Vbl) of the SGD transistor connected to the bit line, and the source (at Vchannel) of the SGD transistor is connected to the string of storage elements. To illustrate, assume Vsg=4 V, Vbl=2.5 V, and, initially, Vchannel=0 V. Here, Vchannel will rise to about 2.5−0.3=2.2 V.

In a second case, Vsgd=Vsgd-nom<Vbl+Vth, and some of Vbl is passed to the channel when the drain-to-source path of the transistor is initially conductive, as a function of Vsgd, until Vchannel rises to a point which renders SGD non-conductive. Vchannel will rise to about Vsgd-nom-Vth-0.3 V. With Vsgd-nom=2.5 V and Vth=1 V, for instance, Vchannel will rise to about 2.5−1−0.3=1.2 V. At this point, Vsgd-nom=Vth+Vchannel, so that SGD becomes non-conductive and the channel floats.

In a third case, Vsgd=Vsgd-low<Vbl+Vth, and, again, some of Vbl is passed to the channel when the drain-to-source path of the transistor is initially conductive, as a function of Vsgd, until Vchannel rises to a point which renders SGD non-conductive. Vchannel will rise to about Vsgd-low-Vth-0.3 V. With Vsgd-low=1.5 V and Vth=1 V, for instance, Vchannel will rise to about 1.5−1−0.3=0.2 V. At this point, Vsgd-low=Vth+Vchannel, so that SGD becomes non-conductive and the channel floats.

When pass voltages are applied to the word line, a floated channel is boosted higher, as a function of the step size of the pass voltage, while a channel which is not floated is not boosted higher.

A portion of a programming iteration is depicted. Specifically, at waveform 1400, a common drain-side select gate voltage (Vsgd) is provided to the drain-side select gates of each NAND string. From t0-t1, Vsgd is raised from 0 V to Vsg. For the inhibited low state (e.g., E-state) bit lines, that is, bit lines which are associated with low state unselected or inhibited storage elements, Vbl is raised from 0 V to Vdd, at waveform 1402. As a result, most of Vbl is passed to the channel, causing pre-charge boosting of the channel region (e.g., ~2.2 V), as depicted by waveform 1412.

At t1, Vsgd transitions from Vsg to a nominal value, Vsgd-nom, which is a desired level for when Vpgm is applied, causing the channel to float and maintain the pre-charge. Thus, t0-t2 is a pre-charge period for the low state storage elements.

For the inhibited high state (e.g., A-, B- or C-state) bit lines, that is, bit lines which are associated with high state unselected or inhibited storage elements, Vbl is at a 0 V from t0-t1 (waveform 1404). As a result, the drain-side select gates for the inhibited high state bit lines are in a conductive state, and the bit lines communicate with the channel regions of the NAND strings, grounding the channel regions from t0-t1, so that no channel boosting occurs (waveform 1414).

Also from t0-t1, the selected bit lines, that is, bit lines associated with selected storage elements, are at 0 V (waveform 1406) for a fast programming mode or at an elevated level such as 0.6 V (waveform 1405) for a slow programming mode. The selected word line (waveform 1408) and the unselected word lines (waveform 1410) are at 0 V.

At t1, Vbl for the inhibited high states is increased from 0V to Vdd. As a result, the channels of the high state storage elements are pre-charged (waveform 1414, when Vsgd-nom is used), as some amount of the bit line voltage reaches the channels before the drain-side select gates are cutoff and float the associated channels. Vchannel (high state) is less than Vchannel (low state) because the select gate is at a lower level than Vsg and therefore cannot pass the bit line voltage to the same extent as for the low state channels. Thus, t1-t2 is a pre-charge period for the high state storage elements. Alternatively, Vsgd is lowered from Vsg to Vsgd-low (waveform 1401), where Vsgd-low<Vsgd-nom, so that the channel is pre-charged to ~0.2 V (waveform 1416), to a lesser extent than waveform 1414. This approach may be desirable when a relatively low channel boosting is desired.

At t2, Vpass (e.g., 6-8V) is applied to the selected word line (waveform 1408) and the unselected word lines (waveform 1410). Since the selected channels are floating, Vpass couples to the channels of the storage elements so that the channel voltages of the high state storage elements and the low state storage elements are boosted by about the same amount. For example, about 0.5×Vpass may be coupled to the channel regions. For instance, with Vpass=8 V, the channel voltages may increase by about 4 V at t2. This provides a Vchannel of, e.g., ~6.2 V, ~5.2 V or ~4.2 V for waveforms 1412, 1414 and 1416, respectively, at t2.

At t3, Vpgm (e.g., 12-25 V) is applied to the selected word line (waveform 1408). This further voltage increase boosts the channel voltages of the high state storage elements (waveform 1414 or 1416) and the low state storage elements (waveform 1412), again by about the same amount, but by an amount (e.g., ~1.5 V) which is generally smaller than when Vpass is raised. This provide a Vchannel of, e.g., ~7.7 V, ~6.7 V or ~5.7 V for waveforms 1412, 1414 and 1416, respectively. For the case where Vsgd-low was applied from t1-t3 (waveform 1401), the Vsgd is ramped up to Vsgd-nom as Vpass is ramped up, so that the drain-side select gate is at an optimum level when Vpgm is applied and programming begins. The drain-side select gates can be cut off if Vsgd-nom is too low, even for the programming channels, causing programming to slow. With Vsgd at Vsgd-nom, the desired bit line voltage of, e.g., 0 V or 0.6 V, is maintained in the channel for selected storage elements.

As mentioned, the boosting effect of Vpgm (e.g., ~1.5 V) is smaller than that of Vpass (e.g., ~4 V) since Vpgm is applied to only one word line while Vpass is applied to almost all word lines. But in general, the contribution of Vpgm and Vpass in total channel boost potential depends on the kind of boosting scheme that is used.

At t4, Vpass and Vpgm are removed, and the channel voltages of the unselected storage elements will transition to about the same level (e.g., ~1 V), since all unselected bit line voltages are at the same level, and all drain-side select gate voltages are at the same level. Moreover, the channel boosting level at t4 will generally be less than the initial pre-charge levels from t0-t2. After t5, a remaining portion of the programming iteration which may include one or more verify operations is performed.

As a result, during the critical period from t3-t4, when Vpgm is applied, optimal channel boosting levels are provided based on the data states of the inhibited storage elements.

One option is to use a different Vsgd-low value for each inhibited state to control the amount of pre-charge, where a lower value of Vsgd-low results in less pre-charge. The lower the value of Vsgd-low, the less bit line voltage is passed to the channel before the drain-side select gate is cut off, and hence the lower is the amount of pre-charge for the corresponding channel.

Figure 15A:
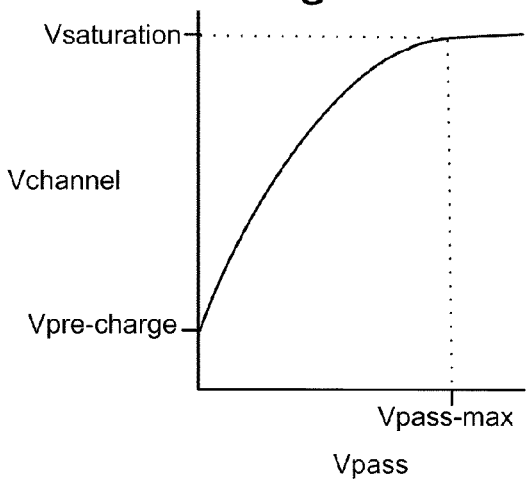
FIG. 15a depicts a channel boost voltage as a function of a pass voltage.

FIG. 15a depicts a channel boost voltage as a function of a pass voltage. Generally, the channel voltage is a non-linear function of Vpass and depends in different factors. Vpre-charge indicates a boosting level which is seen in a pre-charge period. Vchannel generally increases with Vpass, at a slope of, e.g., 0.6, until a saturation voltage is reached at a maximum Vpass, Vpass-max, e.g., 8-9 V. Thus, a high Vpass can result in higher channel boosting but, as mentioned, the level of channel boosting should be tailored to the data state so that the boosting is sufficient but not excessive. As a rough guide, Vchannel=Vpre-charge+0.6×Vpass.

Figure 15B:
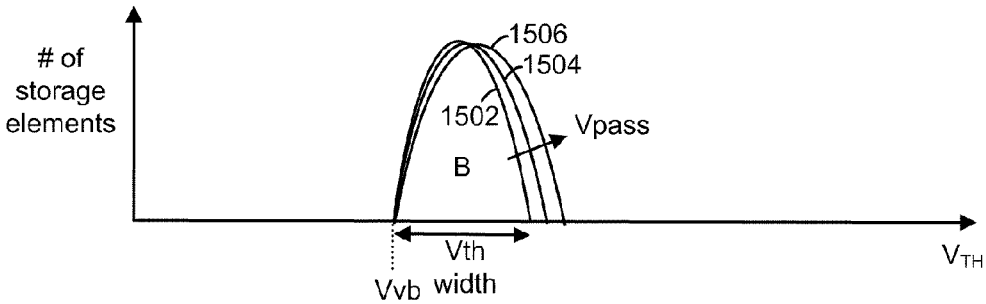
FIG. 15b depicts a widening of a threshold voltage distribution as a function of pass voltage, using data state-independent boosting techniques.

FIG. 15b depicts a widening of a threshold voltage distribution as a function of pass voltage, using data state-independent boosting techniques. For an example state which is the B-state, Vth distributions 1502, 1504 and 1506 are seen with increasing levels of Vpass during programming. Vth width represents a distribution width. Generally, the distribution widens at its upper tail as Vpass increases. As Vpass increases, the channel boosting becomes higher, and channel-to-floating gate coupling to the selected storage elements increases. This indicates that the distribution can be tightened (narrowed) by reducing the channel boosting which is attributed to Vpass for high state storage elements, using data state-dependent boosting techniques.

Figure 15C:
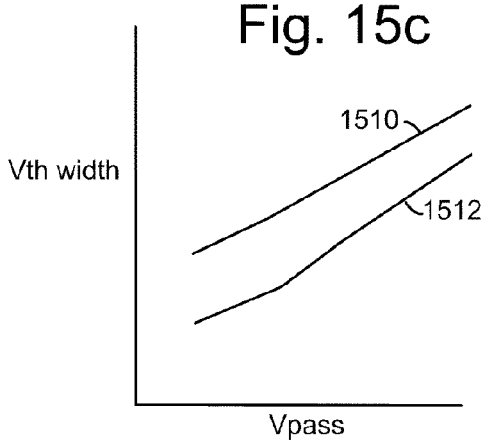
FIG. 15c depicts a width of a threshold voltage distribution as a function of pass voltage, using data state-independent boosting techniques.

FIG. 15c depicts a width of a threshold voltage distribution as a function of pass voltage, using data state-independent boosting techniques. Curve 1510 represents a Vth width which is seen when a channel pre-charge is used, and curve 1512 represents a Vth width which is seen when no channel pre-charge is used. The Vth width increases with Vpass. It can be seen that Vth widths are smaller when no pre-charge is used. Pre-charging from the bit line to the channel can be blocked by appropriate control of the drain-side select gate voltage, such as by applying Vsgd-low to the control gates. Alternatively, or additionally, pre-charging from the bit line to the channel can be blocked by the use of drain side dummy word lines and storage elements, as discussed in connection with FIGS. 16a, 16b and 19.

Figure 16A:
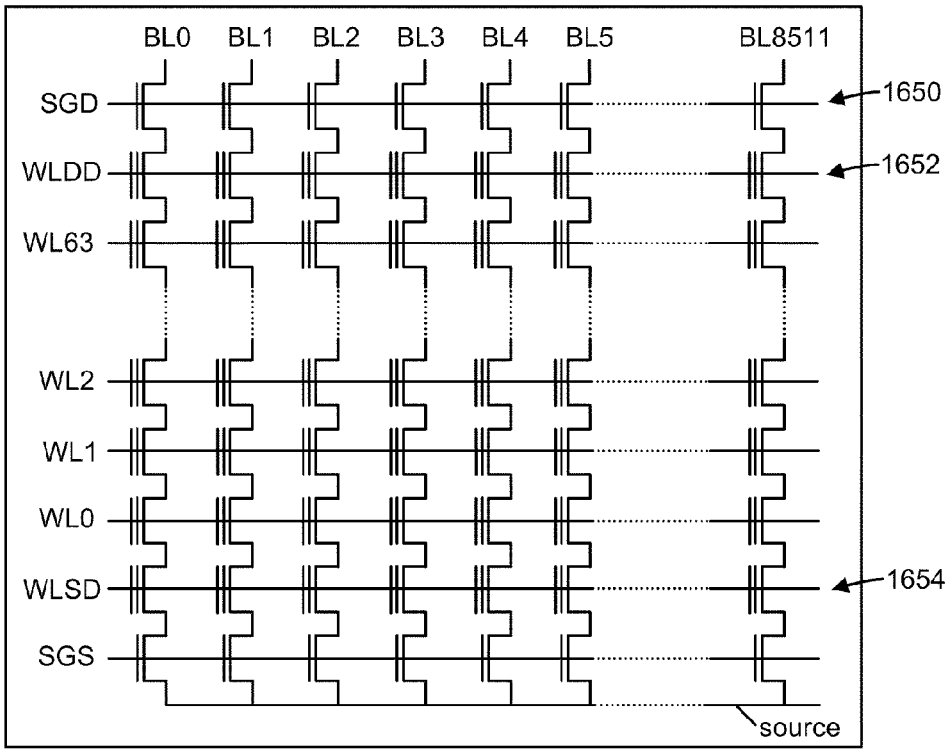
FIG. 16a depicts an example of an organization of a memory array into blocks for an all bit line memory architecture.

For example, in FIG. 16a, see WLDD, a drain-side dummy word line 1652 which is adjacent to the drain-side select gate line SGD 1650. WLDD is connected to drain-side dummy storage elements which are adjacent to drain-side select gates in each NAND string. The drain-side dummy storage elements can be pre-programmed to a data state such as the A-state, such as after an erase operation, before any other word line is programmed. When it is desired to block pre-charging, WLDD is set sufficiently low that so that the drain-side dummy storage elements are in a non-conductive state. At other times, when it is desired to allow channel pre-charging, WLDD is set sufficiently high that so that the drain-side dummy storage elements are in a conductive state. The drain-side dummy word line 1652 and the drain-side select gate control line 1650 may be considered to be control gate lines which are common to drain-side select gates and drain-side dummy storage elements, respectively. A source-side dummy word line 1654 which is adjacent to the source select gate line SGS may also be provided.

FIG. 16a depicts an example of an organization of a memory array into blocks for an all bit line memory architecture. Exemplary structures of memory array 400 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, BL8511. In one embodiment referred to as an all bit line (ABL) architecture, all the bit lines of a block can be simultaneously selected during read and program operations. Storage elements along a common word line and connected to any bit line can be programmed or sensed at the same time.

In the example provided, 64 storage elements and two dummy storage elements are connected in series to form a NAND string. There are sixty four data word lines and two dummy word lines, including a drain-side dummy word line WLDD and a source-side dummy word line, WLSD, where each NAND string includes sixty four data storage elements and two dummy storage elements. Data memory cells can store user or system data, while dummy memory cells are typically not used to store user or system data. Dummy memory cells are generally used to protect user data from being corrupted by certain array-edge effects that can lead to program disturb or endurance degradation.

One terminal of the NAND string is connected to a corresponding bit line via a drain-side select gate (connected to select gate drain lines SGD), and another terminal is connected to a common source via a source select gate (connected to select gate source line SGS).

Figure 16B:
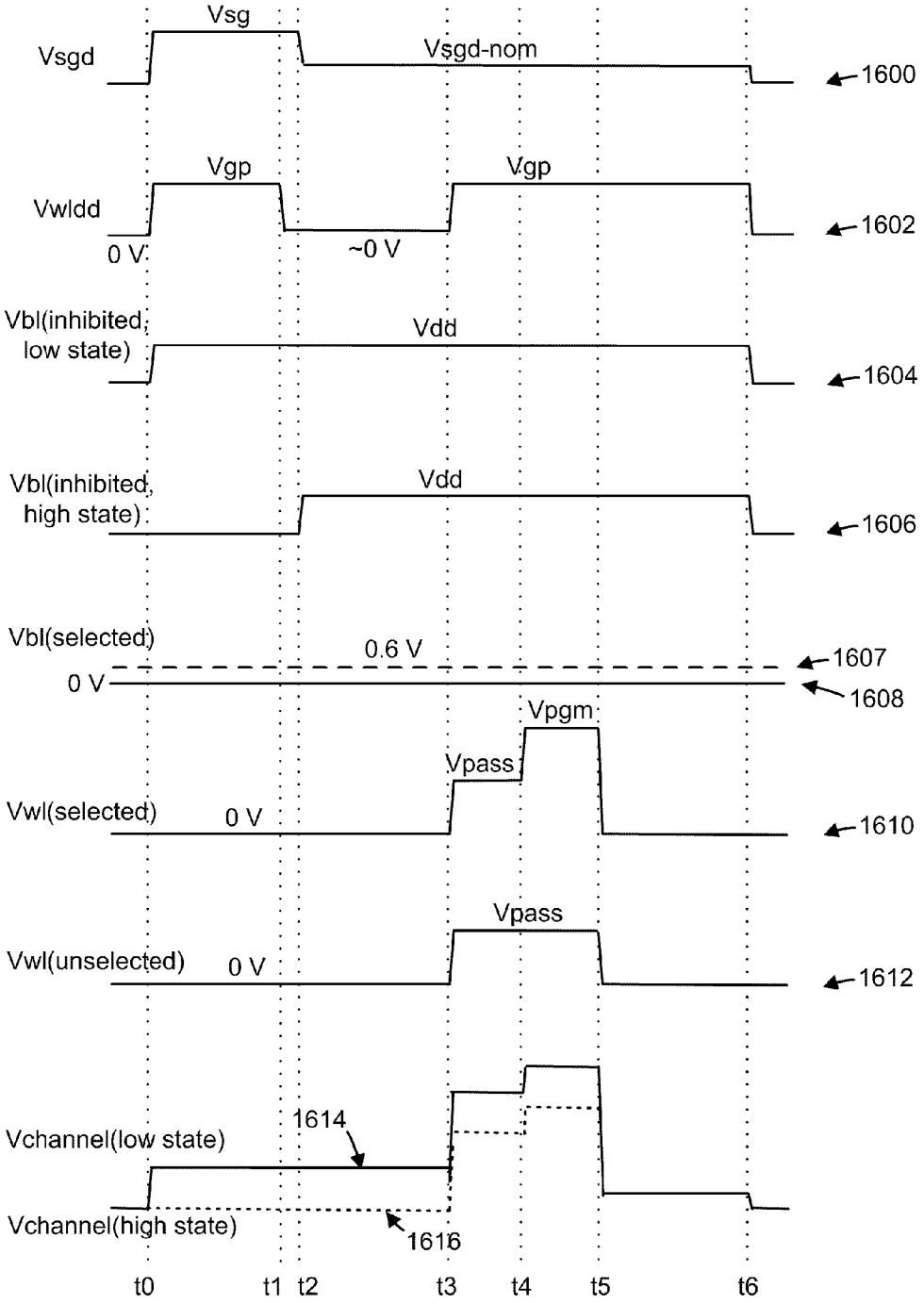
FIG. 16b depicts a second channel boosting technique.

FIG. 16b depicts a second channel boosting technique. Waveforms 1600, 1604, 1606, 1607, 1608, 1610, 1612 and 1614 are the same was waveforms 1400, 1402, 1404, 1405, 1406, 1408, 1410 and 1412, respectively, in FIG. 14. Waveform 1602 represents the voltage Vwldd which is applied to WLDD. At t0, Vsgd is raised from 0 V to Vsg (waveform 1600), and Vwldd is raised from 0 V to Vgp, e.g., ~4 V. Vwldd is sufficiently high that the drain side dummy storage elements are in a conductive state. With Vsg applied, pre-charge is passed through for the low state inhibited channels (waveform 1614), e.g., ~2.2 V, since the associated Vbl is high (waveform 1604), but not for the high state inhibited channels (waveform 1616), since the associated Vbl is 0 V (waveform 1606). In this example, the period t0-t3 represents boosting via the use of specified voltages for bit lines, drain-side select gates, and drain-side dummy storage elements, e.g., in a pre-charge period before pass voltages are applied, and the period t3-t5 represents boosting during a period when pass voltages are applied.

At t1, Vwldd transitions from Vgp to a level of ~0 V, so that the drain side dummy storage elements are in a non-conductive state. This is done just before Vbl (inhibited high state) is raised at t2. When Vbl for the inhibited high states is raised at t2 (waveform 1606), pre-charge is still not passed through for the high state channels (waveform 1616). Vbl should be at Vdd before we start ramping up the word lines to Vpass at t3 to ensure that the channels are cutoff and can be boosted.

At t3, Vwldd is raised up to Vgp so that the drain side dummy storage elements are in a conductive state. However, the drain side select gates are non-conductive, so the channels float and are boosted up, e.g., by ~4 V, due to Vpass, which is also applied at t3. For the low state channels (1614), boosting increases by about the same amount as for the high state channels (1616), but from a lower starting level, e.g., ~0 V.

At t4, when Vpgm is applied (1610), boosting of the low and high state channels increases, again by about the same amount, e.g., ~1.5 V. This provides a Vchannel of, e.g., ~7.7 V and 5.5 V for waveforms 1614 and 1616, respectively.

As an alternative, Vsgd can be set at Vsgd-low from t1-t4 to ensure that essentially no boosting occurs for the high state channels from t1-t4. This may result in a lower peak boosting level for the high state channels than when Vsgd is set at Vsgd-nom.

Simulation results confirm that the dummy drain-side storage elements allow a pre-charge bit line voltage to pass to the channel when the dummy drain-side storage elements are programmed to a sufficiently high Vth such as for the A-state, using a Vwldd such as Vgp=4 V.

As a result, during the critical period from t4-t5, when Vpgm is applied, optimal channel boosting levels are provided based on the data states of the inhibited storage elements.

Figure 17:
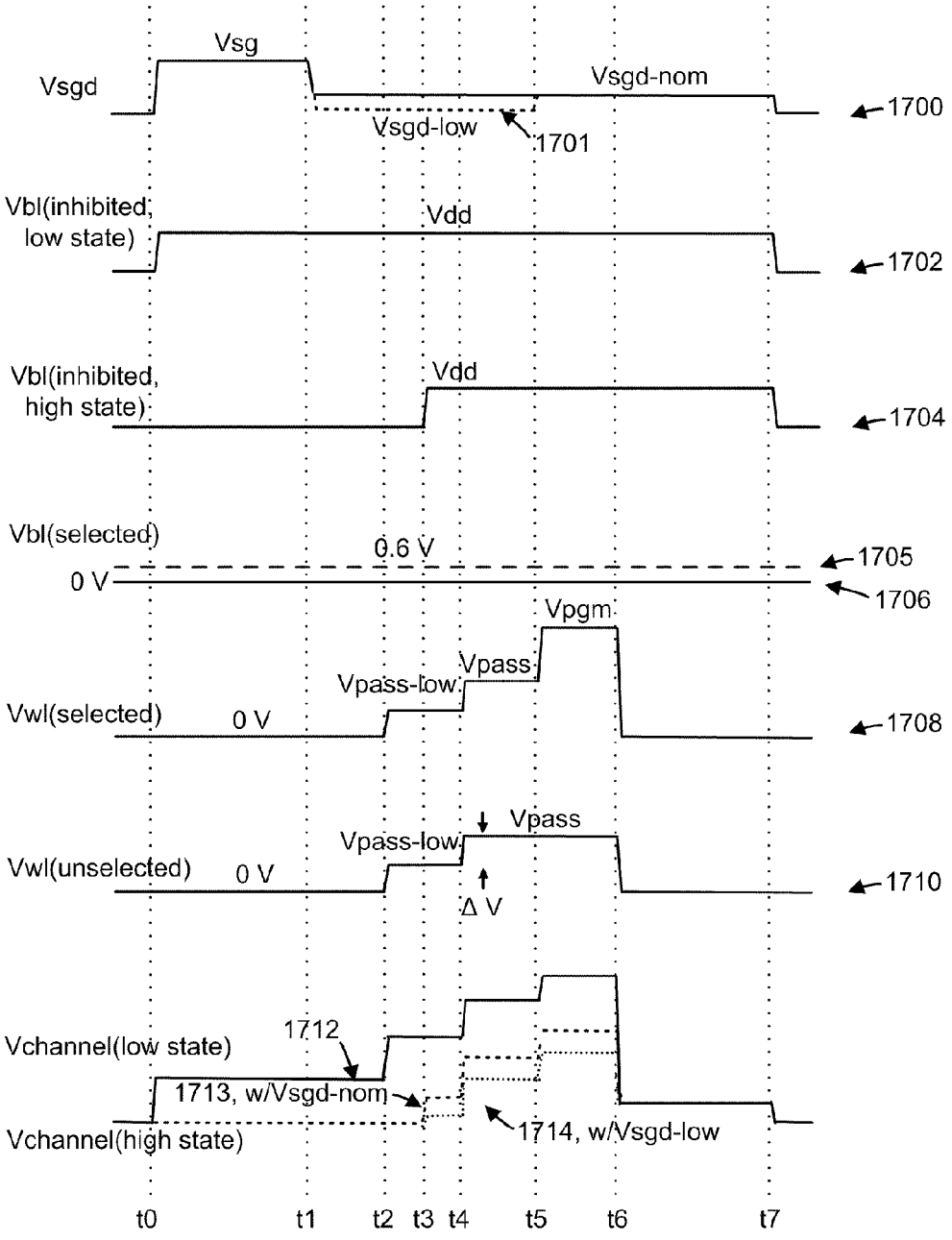
FIG. 17 depicts a third channel boosting technique.

FIG. 17 depicts a third channel boosting technique. By ramping Vpass in multiple steps instead of one step, different channel boosting levels can be achieved in different channels. In particular, lower boosting levels than in the boosting schemes of FIGS. 14a and 16b can be achieved. Waveforms 1700, 1701, 1702, 1704, 1705 and 1706 are the same as waveforms 1400, 1401, 1402, 1404, 1405 and 1406, respectively, in FIG. 14. The low state inhibited channels are boosted (waveform 1712) at t0, when Vsgd is raised to Vsg, with Vbl=Vdd. The high state inhibited channels are not boosted until t3 when Vsgd-nom is used (see waveform 1713), or when Vsgd-low is used (see waveform 1714).

At t2, Vpass-low is applied (waveforms 1708 and 1710), causing higher boosting in the inhibited low state channels (waveform 1712), as a function of the magnitude of the step of Vpass-low—0 V. Boosting can occur in the inhibited low state channels because the drain-side select gates are non-conductive (since Vbl(inhibited low state)=Vdd, so the channels float. Boosting does not occur in the inhibited high state channels because the drain-side select gates are conductive (since Vbl(inhibited high state)=0 V) so the channels are grounded.

In this example, the period t0-t2 represents boosting via the use of specified voltages for bit lines and drain-side select gates during a pre-charge period before pass voltages are applied, and the period t2-t6 represents boosting during a period when pass voltages are applied.

At t3, Vbl is raised to Vdd for the inhibited high state channels, resulting in a channel pre-charge of ~1.2 V when Vsgd-nom is used (waveform 1713) or ~0.2 V when Vsgd-low is used (waveform 1714). At t4, Vpass is applied (waveforms 1708 and 1710), causing higher boosting in the inhibited low state channels (waveform 1712), and in the inhibited high state channels (waveform 1713 or 1714), as a function of the magnitude of ΔV=Vpass−Vpass-low. At t5, Vpgm (waveform 1708) is applied, causing further, similar boosting in the inhibited low state channels (waveform 1712) and the high state channels (waveform 1713 or 1714). When Vsgd-low is used, at t5, Vsgd transitions from Vsgd-low to Vsgd-nom.

Thus, waveforms 1708 and 1710 indicate that the pass voltages are stepped up in multiple steps. Furthermore, waveforms 1702 and 1704 indicate that bit line voltages for the inhibited low state storage elements are raised before the pass voltages are applied, and bit line voltages for the inhibited high state storage elements are raised during one step of the multiple steps, prior to a last step of the multiple steps.

Specifically, the pass voltages are first stepped up from 0 V to a low level, Vpass-low, at t2, and stepped up again from Vpass-low to the nominal Vpass level at t4. Thus, 0<Vpass-low<Vpass. During the first ramp (at t2), Vbl for the inhibited high states is 0 V, so no boosting occurs. Once the word lines have ramped up to Vpass-low, the bit lines are charged up to Vdd (1704). All inhibited storage element's bit line voltages remain at Vdd while the word lines are ramped from Vpass-low to Vpass. In this approach, the pre-charge is reduced/eliminated for the high state inhibited channels. Also, since their bit lines remain at 0 V during the ramp from 0 V to Vpass-low, no boosting occurs. Instead, the effective Vpass swing or difference for these channels is ΔV=Vpass−Vpass-low. Thus, the boosted potential for the high state channels is reduced relative to the low state channels. In particular, lower boosting levels than in the boosting schemes of FIGS. 14a and 16b can be achieved. Vpass-low can be optimized on a memory device to optimize the channel boosting for the high states. For more boosting, Vpass-low can be set lower, and for less boosting, Vpass-low can be set higher (for a given Vpass). A wide range of effective Vpass levels can be set. Vpass-low can be a configurable parameter which is set in the control, e.g., in a ROM fuse.

As an example, Vpass-low=4 V and Vpass=8 V, so that the Vpass steps at t2 and t4 each cause ~2 V channel boost. The Vpgm step at t5 causes ~1.5 V channel boost. In this example, Vchannel at t5 is 7.7 V, 4.7 V and 3.7 V for waveforms 1712, 1713 and 1714, respectively.

Note that the delay from t2-t3 allows Vpass-low to reach and stabilize, e.g., in 2-3 μsec., at the intended level before Vbl (waveform 1704) is raised.

With this approach, from t5-t6, when Vpgm is applied, optimal channel boosting levels are provided based on the data states of the inhibited storage elements.

Figure 18:
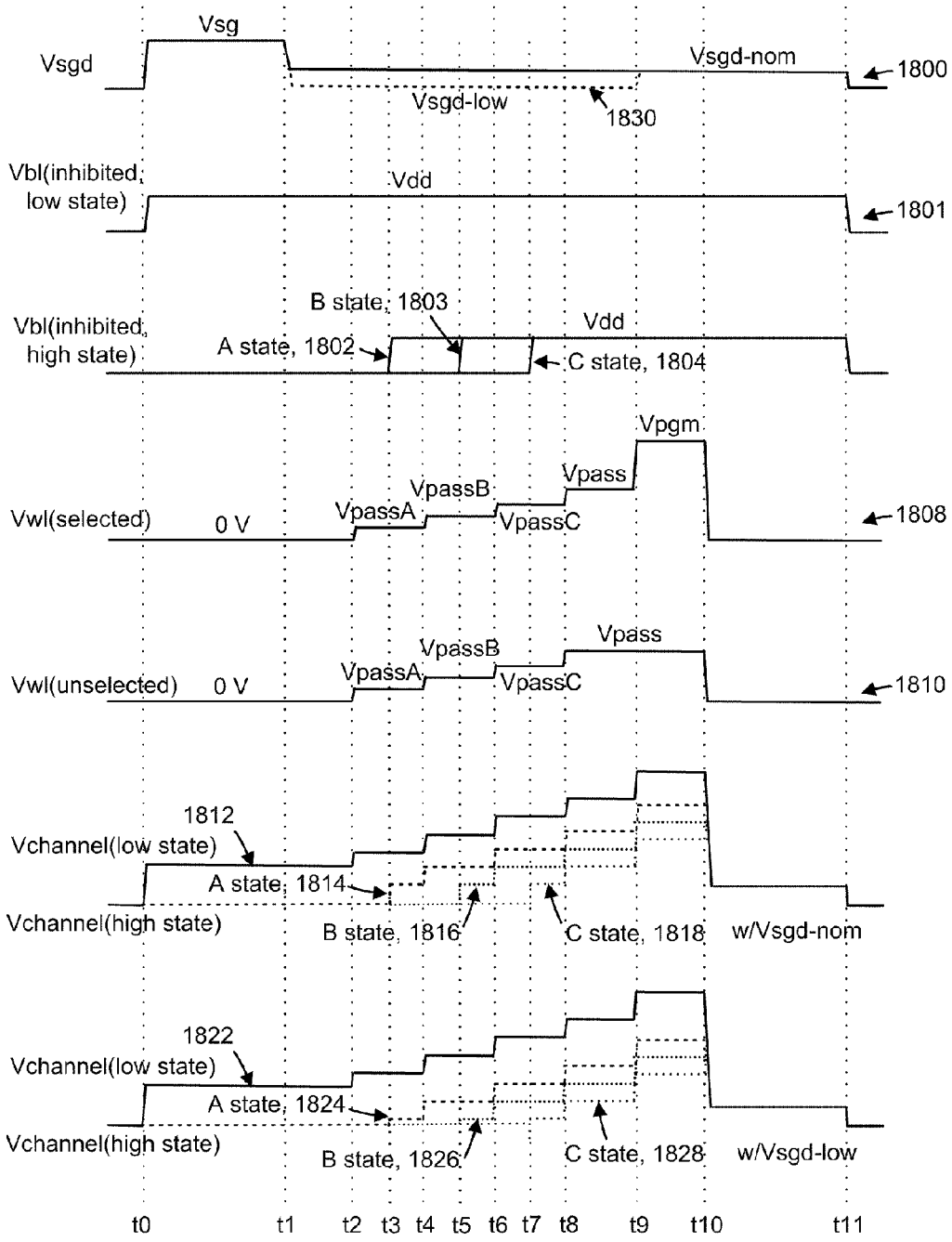
FIG. 18 depicts a fourth channel boosting technique.

FIG. 18 depicts a fourth channel boosting technique. Waveform 1800 denotes Vsgd where Vsgd-nom is used, waveform 1830 denotes Vsgd where Vsgd-low is used as an option, waveform 1801 denotes Vbl for inhibited low state storage elements, waveform 1802 denotes Vbl for inhibited A-state storage elements, waveform 1803 denotes Vbl for inhibited B-state storage elements, waveform 1804 denotes Vbl for inhibited C-state storage elements, waveform 1808 denotes selected word line voltage, waveform 1810 denotes unselected word line voltage, waveforms 1812 and 1822 equivalently denote low state channel boosting, waveforms 1814, 1816 and 1818 denotes A-state, B-state and C-state channel boosting, respectively, when Vsgd-nom is used, and waveforms 1824, 1826 and 1828 denote A-state, B-state and C-state channel boosting, respectively, when Vsgd-low is used. Vbl (selected), not shown, is 0 V or 0.6 V, as discussed previously, for instance.

In the example of FIG. 17, the high state channels were treated alike, being charged and discharged together to provide a simpler implementation. However, it is also possible to treat the different high states, or groups of the high states, differently. For example, instead of charging all high state bit lines to Vdd, e.g., as depicted by waveform 1704 at t3 in FIG. 17, when Vpass-low has been ramped up, the word line voltage can be ramped in four steps, with one step for each data state. In FIG. 18, a ramp from 0 V to VpassA can occur at t2, a ramp from VpassA to VpassB can occur at t4, a ramp from VpassB to VpassC can occur at t6, and a ramp from VpassC to Vpass can occur at t8. See waveforms 1808 and 1810. Vpgm is applied at t9. The bit lines for the inhibited A-state storage elements can be raised at t3, when the word lines stabilize at VpassA, the bit lines for the inhibited B-state storage elements can be raised at t5, when the word lines stabilize at VpassB, and the bit lines for the inhibited C-state storage elements can be raised at t7, when the word lines stabilize at VpassC. In this manner, the effective Vpass swing or difference for each data state can be individually controlled by adjusting VpassA, VpassB and VpassC.

Alternatively, instead of having different intermediate Vpass values for each programmed state, it is possible to have one intermediate Vpass value for a group of states which includes more than one state. For example, an intermediate value Vpass(A,B) can be used for A- and B-states, and an intermediate value Vpass(C) can be used for the C-state. As another example, an intermediate value VpassA can be used for the A-state, and an intermediate value Vpass(B,C) can be used for the B- and C-states. The concept can be modified accordingly when more than four data states are used. For example, with an eight-state memory device having an E-state and A-G programmed states, we might have an intermediate value Vpass(A,B) for the A and B states, an intermediate value Vpass(C,D) for the C and D states, and an intermediate value Vpass(E,F,G) for the E, F and G states.

Generally, the amount of channel boosting experienced is a function of a sum of the pass voltage step sizes when the channel is floated, e.g., when Vbl is raised. Thus, the inhibited A-state channel will be boosted by a function of Vpass-VpassA, the inhibited B-state channel will be boosted by a function of Vpass-VpassB, and the inhibited C-state channel will be boosted by a function of Vpass-VpassC. Note that the step sizes can vary for the different Vpass voltages, and need not be uniform. The step sizes can be a function of the spacing of the Vth of the data states. Moreover, VpassA, VpassB and Vpass C can be configurable in the control of the memory device, e.g., in a ROM fuse. They can be adjusted and optimized.

When Vsgd-nom is used, a pre-charge of, e.g., 1.2 V, is experienced for the channels of A-state, B-state and C-state storage elements at t3, t5 and t7, respectively (waveforms 1814, 1816 and 1818). When Vsgd-low is used, a pre-charge of, e.g., 0.2 V, is experienced for the channels of A-state, B-state and C-state storage elements at t3, t5 and t7, respectively (waveforms 1824, 1826 and 1828).

As an example, VpassA=2 V, VpassB-VpassA=2 V, VpassC-VpassB=2 V and Vpass-VpassC=2 V. The Vpgm step at t5 causes ~1.5 V channel boost. In this example, Vchannel at t9 is 2.2+1+1+1+1+1.5=7.7V (waveform 1812 or 1822), and with Vsgd-nom, 1.2+1+1+1+1.5=5.7 V (waveform 1814), 1.2+1+1+1.5=4.7V (waveform 1816), or 1.2+1+1.5=3.7V (waveform 1818). With Vsgd-low, we have 0.2+1+1+1+1.5=4.7 V (waveform 1824), 0.2+1+1+1.5=3.7 V (waveform 1826), or 0.2+1+1.5=2.7V (waveform 1828).

Note that portions of the different boosting schemes can be combined. For example, in the boosting schemes of FIGS. 17 and 18, it is possible to provide drain-side dummy storage elements which are controlled as discussed in connection with waveform 1602 of FIG. 16b. This can be done to completely block pre-charging, by programming the drain-side dummy storage elements, e.g., to a Vth which approximates a Vth of the A-state. Moreover, the use of Vsgd-low as depicted in FIGS. 14, 17 and 18, can be applied to the boosting scheme of FIG. 16b.

In one embodiment of the technology described herein, a method for operating a non-volatile storage system includes performing at least one programming iteration in which a program pulse is applied to a selected word line. The selected word line is in communication with a subset of storage elements in a set of storage elements which is formed on a substrate, and the selected word line is one word line of a plurality of word lines which are in communication with the set of storage elements. The method further includes, prior to applying the program pulse, determining that a first unselected storage element in the subset of storage elements has a data state which is in a first group of one or more data states, determining that a second unselected storage element in the subset of storage elements has a data state which is in a second group of one or more data states, boosting a first channel region of the substrate which is associated with the first unselected storage element using a first boosting scheme associated with the first group, and boosting a second channel region of the substrate which is associated with the second unselected storage element using a second boosting scheme associated with the second group.

In another embodiment, a non-volatile storage system includes a set of non-volatile storage elements formed on a substrate, where a subset of storage elements in the set of storage elements includes first and second unselected storage elements, and the substrate includes first and second channels regions which are associated with the first and second unselected storage elements, respectively. The system further includes a set of word lines in communication with the set of non-volatile storage elements, including a selected word line which is in communication with the subset of storage elements, where the selected word line is one word line of a plurality of word lines which are in communication with the set of storage elements. The system further includes at least one control circuit. The at least one control circuit: (a) performs at least one programming iteration in which a program pulse is applied to the selected word line, and (b) prior to when the program pulse is applied, determines that the first unselected storage element has a data state which is in a first group of one or more data states, determines that the second unselected storage element has a data state which is in a second group of one or more data states, boosts a first channel region of the substrate which is associated with the first unselected storage element using a first boosting scheme associated with the first group, and boosts a second channel region of the substrate which is associated with the second unselected storage element using a second boosting scheme associated with the second group.

In another embodiment, a non-volatile storage system includes a set of non-volatile storage elements formed on a substrate, where a subset of storage elements in the set of storage elements includes first and second unselected storage elements, and the substrate includes first and second channels regions which are associated with the first and second unselected storage elements, respectively. The system further includes a set of word lines in communication with the set of non-volatile storage elements, including a selected word line which is in communication with the subset of storage elements, where the selected word line is one word line of a plurality of word lines which are in communication with the set of storage elements. The system further includes: (a) means for performing at least one programming iteration in which a program pulse is applied to the selected word line, and (b) means for, prior to when the program pulse is applied, determining that the first unselected storage element has a data state which is in a first group of one or more data states, determining that the second unselected storage element has a data state which is in a second group of one or more data states, boosting a first channel region of the substrate which is associated with the first unselected storage element using a first boosting scheme associated with the first group, and boosting a second channel region of the substrate which is associated with the second unselected storage element using a second boosting scheme associated with the second group.

In another embodiment, a method is provided for operating a non-volatile storage system which includes performing one portion of a programming operation for programming storage elements in a group of non-volatile storage elements formed on a substrate to a plurality of different programmed states, in which at least a first storage element reaches an associated target programmed data state, at least a second storage element remains in an erased state, and at least a third storage element is programmed toward, but does not reach, an associated target programmed data state. The method further includes performing a subsequent portion of the programming operation which includes performing a programming iteration in which, before applying a program pulse to the group of non-volatile storage elements: the at least a first storage element is locked out from further programming, a first channel region of the substrate which is associated with the at least a first storage element is boosted to a first level, and a second channel region of the substrate which is associated with the at least a second storage element is boosted to a second level, higher than the first level.

In another embodiment, a non-volatile storage system includes a group of non-volatile storage elements formed on a substrate, and at least one control circuit. The at least one control circuit performs one portion of a programming operation for programming the storage elements to a plurality of different programmed states, in which at least a first storage element reaches an associated target programmed data state, at least a second storage element remains in an erased state, and at least a third storage element is programmed toward, but does not reach, an associated target programmed data state. The at least one control circuit performs a subsequent portion of the programming operation which includes performing a programming iteration in which, before applying a program pulse to the group of non-volatile storage elements: the at least a first storage element is locked out from further programming, a first channel region of the substrate which is associated with the at least a first storage element is boosted to a first level, and a second channel region of the substrate which is associated with the at least a second storage element is boosted to a second level, higher than the first level.

In another embodiment, a non-volatile storage system includes a group of non-volatile storage elements formed on a substrate, and means for performing one portion of a programming operation for programming the storage elements to a plurality of different programmed states, in which at least a first storage element reaches an associated target programmed data state, at least a second storage element remains in an erased state, and at least a third storage element is programmed toward, but does not reach, an associated target programmed data state. Also provided are means for performing a subsequent portion of the programming operation which includes performing a programming iteration in which, before applying a program pulse to the group of non-volatile storage elements: the at least a first storage element is locked out from further programming, a first channel region of the substrate which is associated with the at least a first storage element is boosted to a first level, and a second channel region of the substrate which is associated with the at least a second storage element is boosted to a second level, higher than the first level.

Corresponding methods, systems and computer- or processor-readable storage devices for performing the methods provided herein are provided.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

What is claimed is:

1. A method for operating a non-volatile storage system, comprising:

performing at least one programming iteration in which a program pulse is applied to a selected word line, the selected word line is in communication with a subset of storage elements in a set of storage elements which is formed on a substrate, and the selected word line is one word line of a plurality of word lines which are in communication with the set of storage elements; and prior to applying the program pulse, determining that a first unselected storage element in the subset of storage elements has a data state which is in a first group of one or more data states, determining that a second unselected storage element in the subset of storage elements has a data state which is in a second group of one or more data states, boosting a first channel region of the substrate which is associated with the first unselected storage element using a first boosting scheme associated with the first group, and boosting a second channel region of the substrate which is associated with the second unselected storage element using a second boosting scheme associated with the second group.

2. The method of claim 1, wherein:

the first and second unselected storage elements are storage elements which are locked out from programming.

3. The method of claim 1, wherein:

at least one of the first and second groups is associated with multiple data states.

4. The method of claim 1, wherein:

the first group is associated with one or more verify levels which are lower than one or more verify levels with which the second group is associated; and the first boosting scheme boosts the first channel region to a higher level than a level to which the second channel region is boosted by the second boosting scheme.

5. The method of claim 1, wherein:

the first and second storage elements are in communication with first and second bit lines, respectively;

the first boosting scheme involves boosting the first channel region via the first bit line, and subsequently boosting the first channel region further via pass voltages which are applied to the plurality of word lines; and the second boosting scheme precludes boosting of the second channel region via the second bit line, and subsequently boosts the second channel region via the pass voltages which are applied to the plurality of word lines.

6. The method of claim 1, wherein:

the first and second storage elements are in communication with first and second bit lines, respectively;

the first boosting scheme involves boosting the first channel region via the first bit line, and subsequently boosting the first channel region further via pass voltages which are applied to the plurality of word lines; and the second boosting scheme involves boosting the second channel region via the second bit line, the second channel region is boosted via the second bit line to a lesser extent than an extent to which the first channel is boosted via the first bit line, and subsequently boosting the second channel region further via the pass voltages which are applied to the plurality of word lines.

7. The method of claim 1, wherein:

the first storage element is in communication with a dummy drain-side storage element and a bit line; and the first boosting scheme involves boosting the first channel region via the first bit line, by controlling the dummy drain-side storage element to be in a conductive state and to subsequently be in a non-conductive state, and subsequently boosting the first channel region further via pass voltages which are applied to the plurality of word lines.

8. The method of claim 1, wherein:

the first and second storage elements are in communication with first and second bit lines, respectively; *and* the first and second boosting schemes involve boosting the first and second channel regions, respectively, via pass voltages which are applied to the plurality of word lines, the pass voltages are applied in multiple steps, a voltage of the first bit line is raised before the pass voltages are applied, and a voltage of the second bit line is raised during one step of the multiple steps, prior to a last step of the multiple steps.

9. The method of claim 1, wherein:

the determining that the first unselected storage element has a data state which is in the first group comprises accessing at least one latch which is associated with the first unselected storage element.

10. The method of claim 9, wherein:

the at least one latch was used in a previous programming iteration to indicate that the first unselected storage element was subject to slow speed programming.

11. The method of claim 1, wherein:

the boosting of the first and second channel regions provides the first and second channels at respective first and second boosted levels when the program pulse is applied.

12. A non-volatile storage system, comprising:

a set of non-volatile storage elements formed on a substrate, a subset of storage elements in the set of storage elements includes first and second unselected storage elements, and the substrate includes first and second channels regions which are associated with the first and second unselected storage elements, respectively;

a set of word lines in communication with the set of non-volatile storage elements, including a selected word line which is in communication with the subset of storage elements, where the selected word line is one word line of a plurality of word lines which are in communication with the set of storage elements; and at least one control circuit, the at least one control circuit: (a) performs at least one programming iteration in which a program pulse is applied to the selected word line, and (b) prior to when the program pulse is applied, determines that the first unselected storage element has a data state which is in a first group of one or more data states, determines that the second unselected storage element has a data state which is in a second group of one or more data states, boosts a first channel region of the substrate which is associated with the first unselected storage element using a first boosting scheme associated with the first group, and boosts a second channel region of the substrate which is associated with the second unselected storage element using a second boosting scheme associated with the second group.

13. The non-volatile storage system of claim 12, wherein:

at least one of the first and second groups is associated with multiple data states.

14. The non-volatile storage system of claim 12, wherein:

the first group is associated with one or more verify levels which are lower than one or more verify levels with which the second group is associated; and the first boosting scheme boosts the first channel region to a higher level than a level to which the second channel region is boosted by the second boosting scheme.

15. The non-volatile storage system of claim 12, wherein:

the first and second storage elements are in communication with first and second bit lines, respectively;

in the first boosting scheme, the at least one control circuit boosts the first channel region via the first bit line, and subsequently boosts the first channel region further via pass voltages which are applied to the plurality of word lines; and in the second boosting scheme, at least one control circuit precludes boosting of the second channel region via the second bit line, and subsequently boosts the second channel region via the pass voltages which are applied to the plurality of word lines.

16. The non-volatile storage system of claim 12, wherein:

the first and second storage elements are in communication with first and second bit lines, respectively;

in the first boosting scheme, at least one control circuit boosts the first channel region via the first bit line, and subsequently boosts the first channel region further via pass voltages which are applied to the plurality of word lines; and in the second boosting scheme, at least one control circuit boosts the second channel region via the second bit line, where the second channel region is boosted via the second bit line to a lesser extent than an extent to which the first channel is boosted via the first bit line, and subsequently boosts the second channel region further via the pass voltages which are applied to the plurality of word lines.

17. The non-volatile storage system of claim 12, wherein:

the first storage element is in communication with a dummy drain-side storage element and a bit line; and in the first boosting scheme, at least one control circuit boosts the first channel region via the first bit line, by controlling the dummy drain-side storage element to be in a conductive state and subsequently be in a non-conductive state, and subsequently boosts the first channel region further via pass voltages which are applied to the plurality of word lines.

18. The non-volatile storage system of claim 12, wherein:

the first and second storage elements are in communication with first and second bit lines, respectively; *and* in the first and second boosting schemes, at least one control circuit boosts the first and second channel regions, respectively, via pass voltages which are applied to the plurality of word lines, the pass voltages are applied in multiple steps, a voltage of the first bit line is raised before the pass voltages are applied, and a voltage of the second bit line is raised during one step of the multiple steps, prior to a last step of the multiple steps.

*19. The method of claim 1, wherein:*

*the set of storage elements is arranged in a three-dimensional memory structure.*

*20. The non-volatile storage system of claim 12, wherein:*

*the set of non-volatile storage elements is arranged in a three-dimensional memory structure.*

* * * * *